(12) United States Patent
Kral

(10) Patent No.: US 7,734,272 B2
(45) Date of Patent: *Jun. 8, 2010

(54) LOCAL OSCILLATOR APPARATUS AND METHOD

(75) Inventor: Alexandre Kral, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/976,181

(22) Filed: Oct. 22, 2007

(65) Prior Publication Data

US 2008/0051051 A1 Feb. 28, 2008

Related U.S. Application Data

(60) Continuation of application No. 10/647,588, filed on Aug. 26, 2003, now Pat. No. 7,286,811, which is a division of application No. 09/995,695, filed on Nov. 29, 2001, now Pat. No. 7,139,547.

(60) Provisional application No. 60/250,616, filed on Nov. 29, 2000, now abandoned.

(51) Int. Cl.
*H04B 1/28* (2006.01)
(52) U.S. Cl. ............... 455/333; 455/334; 455/339; 455/315; 455/316; 375/316; 375/345
(58) Field of Classification Search ........... 455/333, 455/334, 339, 340, 341, 344, 316, 315, 194.2, 455/196.1, 209, 236.1; 375/316, 345
See application file for complete search history.

(56) References Cited

U.S. PATENT DOCUMENTS 3,872,329 A 3/1975 Dodson, III

| 4,331,944 A | 5/1982 | Lee |
| 4,354,250 A | 10/1982 | Lee |
| 4,849,661 A | 7/1989 | Bazes |

(Continued)

FOREIGN PATENT DOCUMENTS

DE 199 24 039 A1 12/1999

(Continued)

OTHER PUBLICATIONS

International Search Report for Appln. No. PCT/US01/44321, issued Oct. 30, 2002, 7 pages.

(Continued)

*Primary Examiner*—Tuan A Pham
(74) *Attorney, Agent, or Firm*—Sterne, Kessler, Goldstein & Fox P.L.L.C.

(57) ABSTRACT

A direct conversion satellite tuner is fully integrated on a common substrate. The integrated tuner receives an RF signal having a plurality of channels and down-converts a selected channel directly to baseband for further processing. The integrated tuner includes on-chip local oscillator generation, tunable baseband filters, and DC Offset cancellation. The integrated tuner can be implemented in a completely differential I/Q configuration for improved electrical performance. The entire direct conversion satellite tuner can be fabricated on a single semiconductor substrate using standard CMOS processing, with minimal off-chip components. The tuner configuration described herein is not limited to processing TV signals, and can be utilized to down-convert other RF signals to an IF frequency or baseband.

12 Claims, 25 Drawing Sheets

U.S. PATENT DOCUMENTS

| | | | |
|---|---|---|---|
| 5,086,512 A * | 2/1992 | Bartz | 455/168.1 |
| 5,210,504 A | 5/1993 | Yagita et al. | |
| 5,303,258 A | 4/1994 | Nakamura | |
| 5,493,710 A | 2/1996 | Takahara et al. | |
| 5,604,501 A | 2/1997 | McPartland | |
| 5,757,921 A | 5/1998 | Okanobu et al. | |
| 5,819,157 A | 10/1998 | Ben-Efraim et al. | |
| 5,859,559 A | 1/1999 | Hong et al. | |
| 5,884,154 A | 3/1999 | Sano et al. | |
| 5,930,696 A | 7/1999 | Tzuang et al. | |
| 5,942,935 A | 8/1999 | Okanobu | |
| 5,950,112 A | 9/1999 | Hori et al. | |
| 5,991,612 A | 11/1999 | Saito | |
| 6,014,571 A * | 1/2000 | Enoki | 455/552.1 |
| 6,031,878 A | 2/2000 | Tomasz et al. | |
| 6,037,825 A | 3/2000 | Kung | |
| 6,069,510 A | 5/2000 | Keeth | |
| 6,122,497 A | 9/2000 | Gilbert | |
| 6,150,875 A | 11/2000 | Tsinker | |
| 6,160,571 A | 12/2000 | Wang | |
| 6,166,591 A | 12/2000 | Schultz et al. | |
| 6,218,885 B1 | 4/2001 | Ellis | |
| 6,246,864 B1 | 6/2001 | Koike | |
| 6,347,126 B1 | 2/2002 | Nagayasu et al. | |
| 6,512,801 B1 * | 1/2003 | Ninomiya | 375/316 |
| 6,529,100 B1 | 3/2003 | Okanobu | |
| 6,529,721 B1 | 3/2003 | Tiller | |
| 6,563,383 B1 | 5/2003 | Otaka et al. | |
| 6,564,045 B1 | 5/2003 | Fransis | |
| 6,583,661 B1 | 6/2003 | Tanji et al. | |
| 6,631,257 B1 | 10/2003 | White et al. | |
| 6,693,980 B1 | 2/2004 | Linder et al. | |
| 6,720,839 B1 | 4/2004 | Torre et al. | |
| 6,731,712 B1 | 5/2004 | Lindstrom et al. | |
| 6,801,585 B1 * | 10/2004 | Nguyen et al. | 375/327 |
| 6,807,406 B1 | 10/2004 | Razavii et al. | |
| 2002/0039052 A1 * | 4/2002 | Straub et al. | 331/45 |
| 2002/0042255 A1 | 4/2002 | Prentice | |
| 2002/0120937 A1 | 8/2002 | Chang | |
| 2002/0190783 A1 | 12/2002 | Duncan et al. | |
| 2003/0045263 A1 | 3/2003 | Wakayama et al. | |
| 2003/0143960 A1 | 7/2003 | Yamawaki et al. | |

FOREIGN PATENT DOCUMENTS

| | | |
|---|---|---|
| GB | 2 339 351 | 1/2000 |
| WO | WO 00/13306 | 3/2000 |

OTHER PUBLICATIONS

Written Opinion from PCT Appln. No. PCT/US01/44321, filed Nov. 29, 2001, 6 pages (mailing date of written opinion—Jul. 23, 2003).

Sedra et al., "MicroElectronic Circuits," CBS College Publishing, New York, New York, 1987, pp. 96-100 and 805.

* cited by examiner

|  | AMP 356a | AMP 356b | AMP 356c | AMP 356d | AMP 356e | AMP 356f | AMP 356g | AMP 356h | AMPS 356i | AMPS 356j |
|---|---|---|---|---|---|---|---|---|---|---|
| VCO 318a | ON | OFF | OFF | OFF | ON | OFF | OFF | ON | ON | OFF |
| VCO 318b | OFF | ON | OFF | OFF | ON | OFF | OFF | ON | ON | OFF |
| VCO 318c | OFF | OFF | ON | OFF | OFF | ON | ON | OFF | OFF | ON |
| VCO 318d | OFF | OFF | OFF | ON | OFF | ON | ON | OFF | OFF | ON |

FIG. 4

LOCAL OSCILLATOR APPARATUS AND METHOD

CROSS-REFERENCE TO RELATED APPLICATIONS

This application is a continuation application of U.S. patent application Ser. No. 10/647,588, filed on Aug. 26, 2003, which is a divisional application of U.S. patent application Ser. No. 09/995,695, filed on Nov. 29, 2001, which claims priority to U.S. Provisional Application No. 60/250,616, filed on Nov. 29, 2000, both of which are incorporated herein by reference in its entirety.

BACKGROUND OF THE INVENTION

1. Field of the Invention

The present invention generally relates to receiver circuits, and more specifically to a direct conversion satellite tuner that is integrated on a single semiconductor substrate.

2. Background Art

Direct satellite television broadcasts television signals directly from a satellite to a user, without any terrestrial re-transmission of the television signals. At the user location, a satellite dish receives the satellite signals, and a satellite receiver retrieves the baseband information for display on a standard television set.

In addition to television service, direct satellite television systems are also being configured to offer Internet service, including broadband or high speed Internet service.

Direct satellite television signals occupy a frequency spectrum from 950 MHz to 2150 MHz, with a channel spacing of approximately 29.16 MHz and a channel bandwidth of approximately 26.4 MHz. Therefore, approximately 40 channels are available in the 950-2150 MHz frequency band.

The modulation scheme that is utilized for satellite television signals is quadrature phase shift keying (QPSK). QPSK provides a data constellation having 4 possible positions, where each position represents two data bits. As a result, more than 40 information channels can be transmitted over the allotted frequency bandwidth since each constellation position represents two data bits.

Future satellite television systems may be expanded to 8 PSK, further increasing the number of information channels that can be transmitted over the allotted frequency bandwidth.

Conventional satellite receivers utilize a hybrid configuration of multiple chips, boards, and/or substrates. For example, the local oscillator source, one or more mixers, and the baseband filter are typically on different substrates from each other. As a result, these multiple substrates must be assembled and electrically connected together, which increases manufacturing time and cost. Furthermore, electrical parasitics are associated with driving high frequency signals from one substrate to another, and can reduce electrical performance. Often times, individual components need to be tuned to compensate for the parasitics associated with driving a high frequency signal from one substrate to another.

Therefore, a single chip solution is highly desirable for satellite television tuners. The single chip solution will eliminate the need to connect multiple substrates together during manufacturing, and therefore will lead to a reduction in manufacturing time and cost. The single chip solution will likely improve electrical performance of the tuner as the parasitics associated with driving a signal off-chip will be eliminated. Additionally, the single chip solution will reduce the size of the satellite tuners, which becomes more critical for non-TV set applications. Therefore, what is required is a satellite tuner architecture that can be implemented on a single semiconductor substrate.

Additionally, the channel bandwidth requirements at baseband vary from one service provider to another, often based on geographic location. For example, a European service provider will typically have a different bandwidth requirement than a North American service provider. Conventional tuners do not have the ability to tune baseband bandwidth on chip in realtime. Therefore, the service provider must be identified during manufacturing so that the baseband filter bandwidth can set accordingly. Therefore, it would be advantageous for a single-chip tuner to have the capability of tuning the bandwidth of the baseband output so that the tuner could be mass produced without prior knowledge of the service provider and the corresponding baseband bandwidth requirement.

BRIEF SUMMARY OF THE INVENTION

The present invention is directed to an integrated tuner for processing radio frequency (RF) signals that have a plurality of channels. The integrated tuner down-converts a selected channel directly from an RF frequency to a baseband frequency, for subsequent processing.

The integrated tuner includes a local oscillator (LO) generation circuit, a differential direct conversion mixer, a differential tunable lowpass filter, and a DC compensation circuit, all of which are disposed on a common substrate. The LO generation circuit generates a differential LO signal that is sent to the differential direct conversion mixer. The differential direct conversion mixer circuit mixes the RF signal with the differential LO signal, where the frequency of the differential LO signal is determined to down-convert a selected channel in the RF signal directly to baseband. The LO correction circuit adjusts the amplitude level of the differential LO signal so as to improve the performance of the differential direct conversion mixer. The differential tunable lowpass filter filters the differential baseband signal to remove unwanted frequencies. The DC compensation circuit detects any DC offset in the differential baseband signal and cancels the DC offset using negative feedback.

The integrated tuner is fully integrated on a single semiconductor substrate and can use standard semiconductor processes, such as CMOS. As such there is no need for assembling multiple different substrates or chips. Unlike conventional tuners, both the local oscillator (LO) and the baseband filtering functions are performed on-chip, representative of the full integration. Furthermore, the baseband filter tuning is also performed on-chip. Furthermore, in embodiments of the invention, the tuner is completely differential, thereby improving phase noise performance and facilitating the mitigation of unwanted common mode voltages and DC offset.

In embodiments of the invention, the integrated tuner is configured to process an RF signal that is a direct satellite television signal that occupies a frequency range from 950-2150 MHz.

In embodiments of the invention, the LO generation circuit is a PLL having a plurality of VCOs, where each VCO covers a different frequency band. A VCO is selected based on the desired frequency of the differential LO signal and the channel that is to be selectively down-converted to baseband.

In embodiments of the invention, the integrated tuner is configured for in-phase (I) and quadrature (Q) operation. Therefore, the LO generation circuit generates I and Q differential LO signals. Furthermore, the differential direct conversion mixer includes I and Q mixers that generate corresponding I and Q baseband signals. The I and Q baseband signals are received by corresponding first and second tunable lowpass filters, and corresponding first and second DC compensation circuits.

In embodiments of the invention, the differential direct conversion mixer includes an RF transconductance circuit and a LO switching circuit. The RF transconductance circuit includes a pair of field effect transistor to convert the received differential RF signal to a differential RF current. The differential direct conversion mixer further includes a means of adding a DC current (that does not flow through the LO switching circuit) to the pair of transistors so as to minimize flicker noise.

In embodiments of the invention, the differential tunable lowpass filter includes a plurality of integrators, each integrator having a resistor and a capacitor. The cutoff frequency of the differential tunable lowpass filter is tuned by adjusting either the resistor or the capacitor in the integrators. In one embodiment, the capacitor is a fixed metal oxide semiconductor capacitor (MOSCAP), and the cutoff frequency of the differential lowpass filter is tuned by adjusting a value of the resistor.

In embodiments of the invention, the DC compensation circuit includes a DC servo circuit that detects any DC offset voltage in a second baseband amplifier and cancels the DC offset voltage at the output of a first amplifier, which can be a variable gain amplifier (VGA). The DC servo circuit includes a first transconductance amplifier, a lowpass filter, and a second transconductance amplifier. The first transconductance amplifier detects the output of the second baseband amplifier, and converts the output of the second baseband amplifier to a differential current. The lowpass filter has a cutoff frequency that passes only the DC offset information in the differential current and rejects the baseband signal information. Finally, the second transconductance amplifier is connected 180 degrees out-of-phase with the VGA so that the DC offset is canceled at the input of the VGA.

Further features and advantages of the present invention, as well as the structure and operation of various embodiments of the present invention, are described in detail below with reference to the accompanying drawings.

BRIEF DESCRIPTION OF THE DRAWINGS/FIGURES

The present invention is described with reference to the accompanying drawings. In the drawings, like reference numbers indicate identical or functionally similar elements. Additionally, the left-most digit(s) of a reference number identifies the drawing in which the reference number first appears.

FIG. 4 illustrates a VCO control table that identifies which amplifiers should be powered up to select a particular VCO.

Figure 5A:
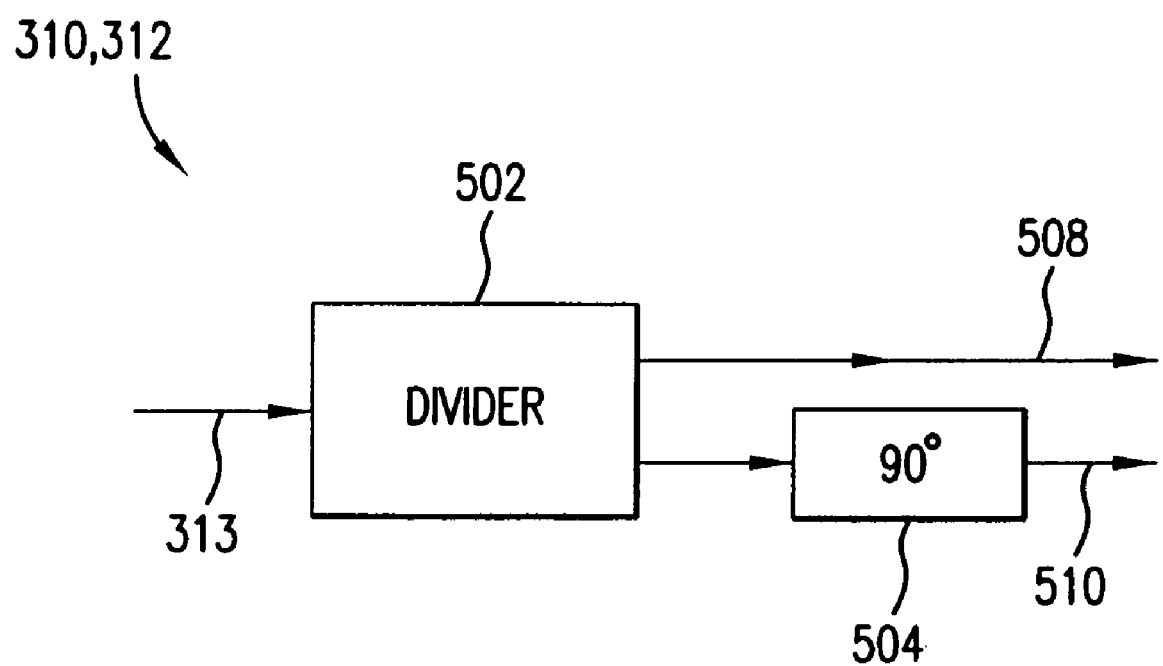
FIG. 5A illustrates a functional description of a polyphase circuit.
Figure 5B:
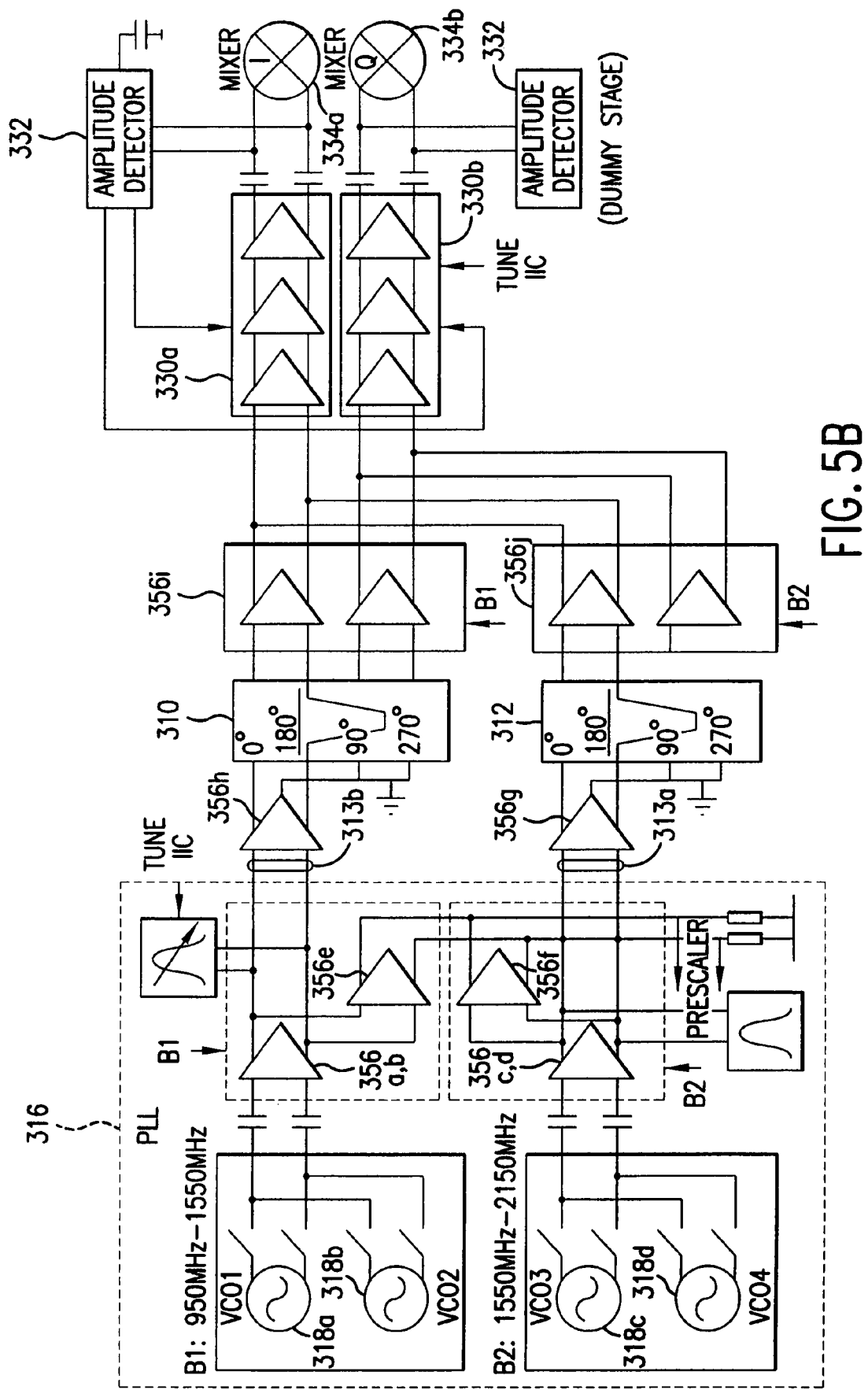

FIG. 5B further illustrates the LO generation circuit according to embodiments of the present invention.

Figure 6:
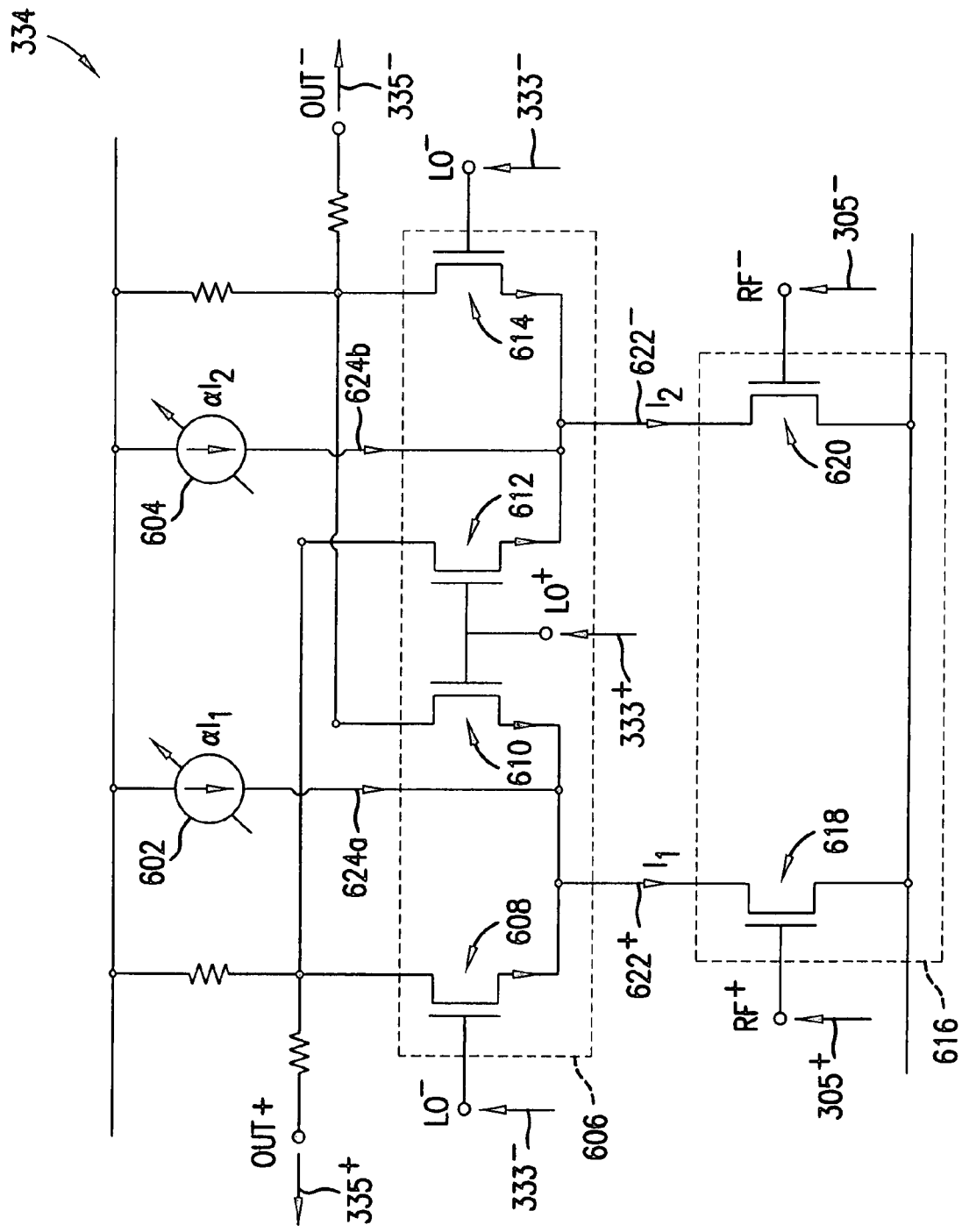

FIG. 6 illustrates a modified differential Gilbert cell mixer according to embodiments of the invention.

Figure 7:
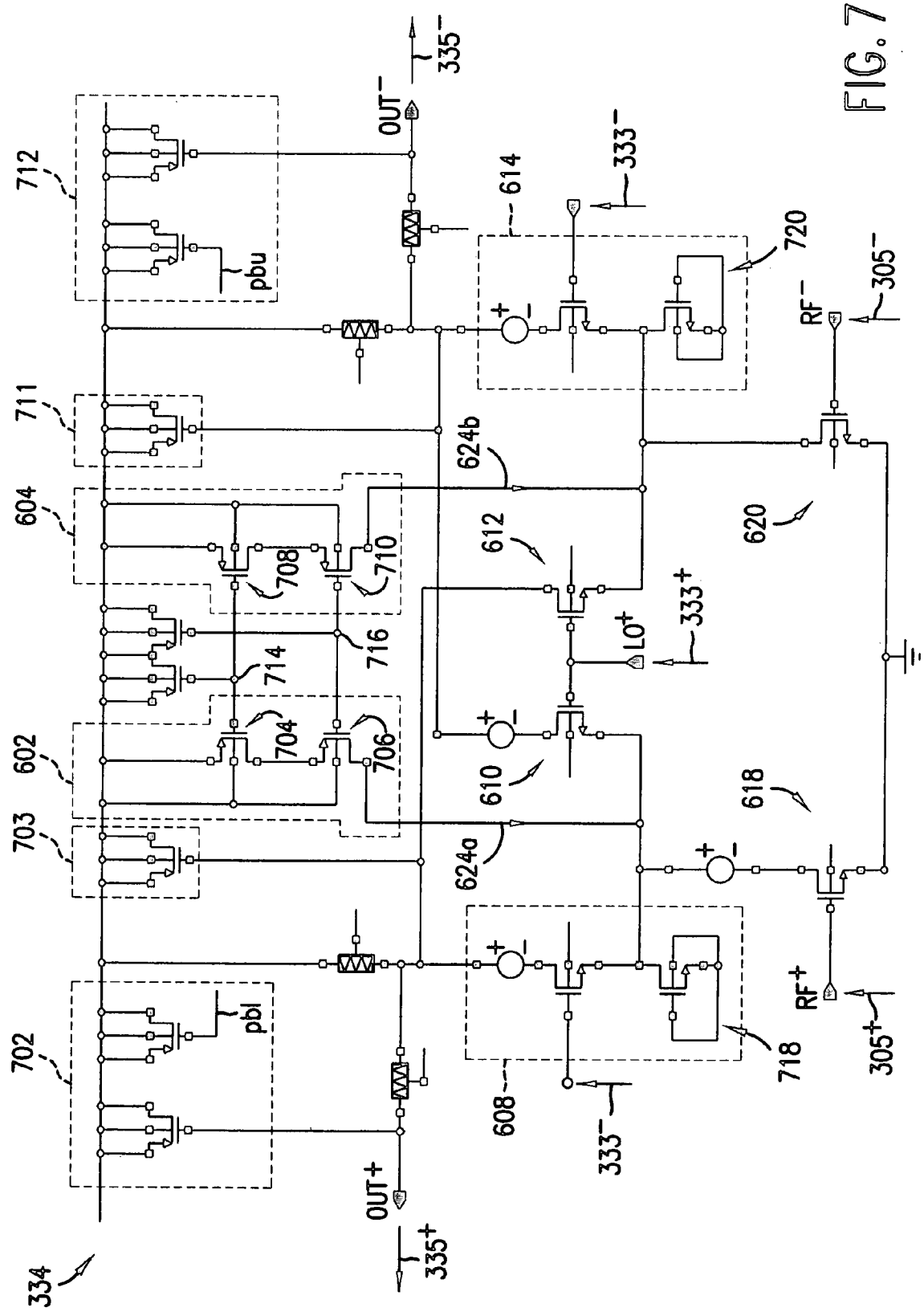

FIG. 7 further describes the modified Gilbert cell mixer in FIG. 6 according to embodiments of the invention.

Figure 8:
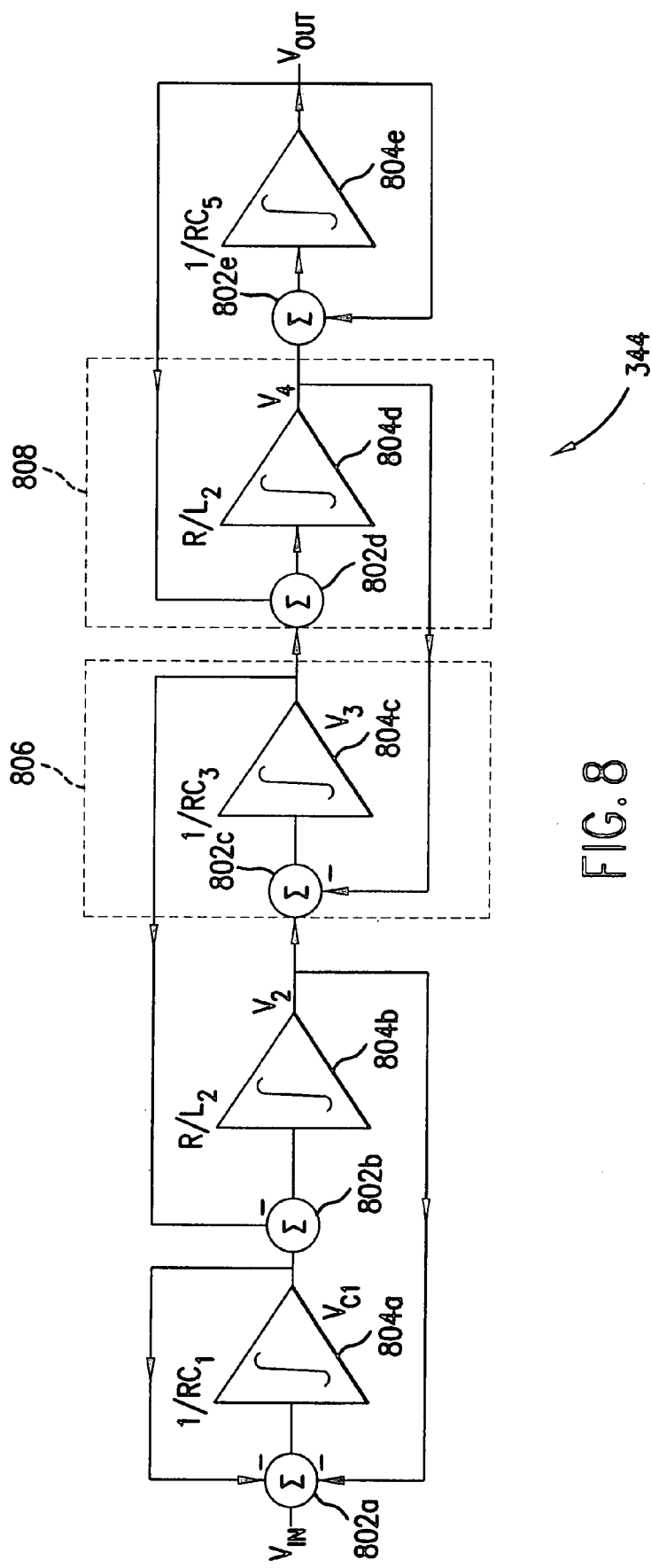

FIG. 8 illustrates a tunable baseband lowpass filter implementing leapfrog synthesis according to embodiments of the invention.

Figure 9:
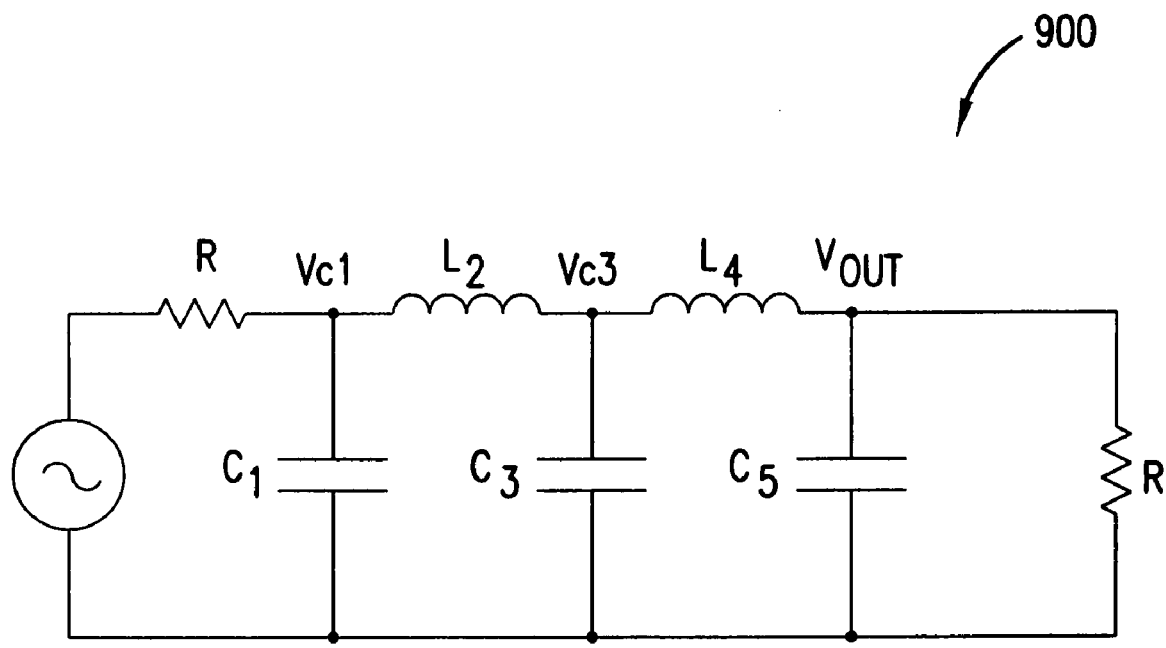

FIG. 9 illustrates a conventional lowpass Butterworth filter that is simulated by the tunable bandpass filter in FIG. 8, according to embodiments of the present invention.

Figure 10:
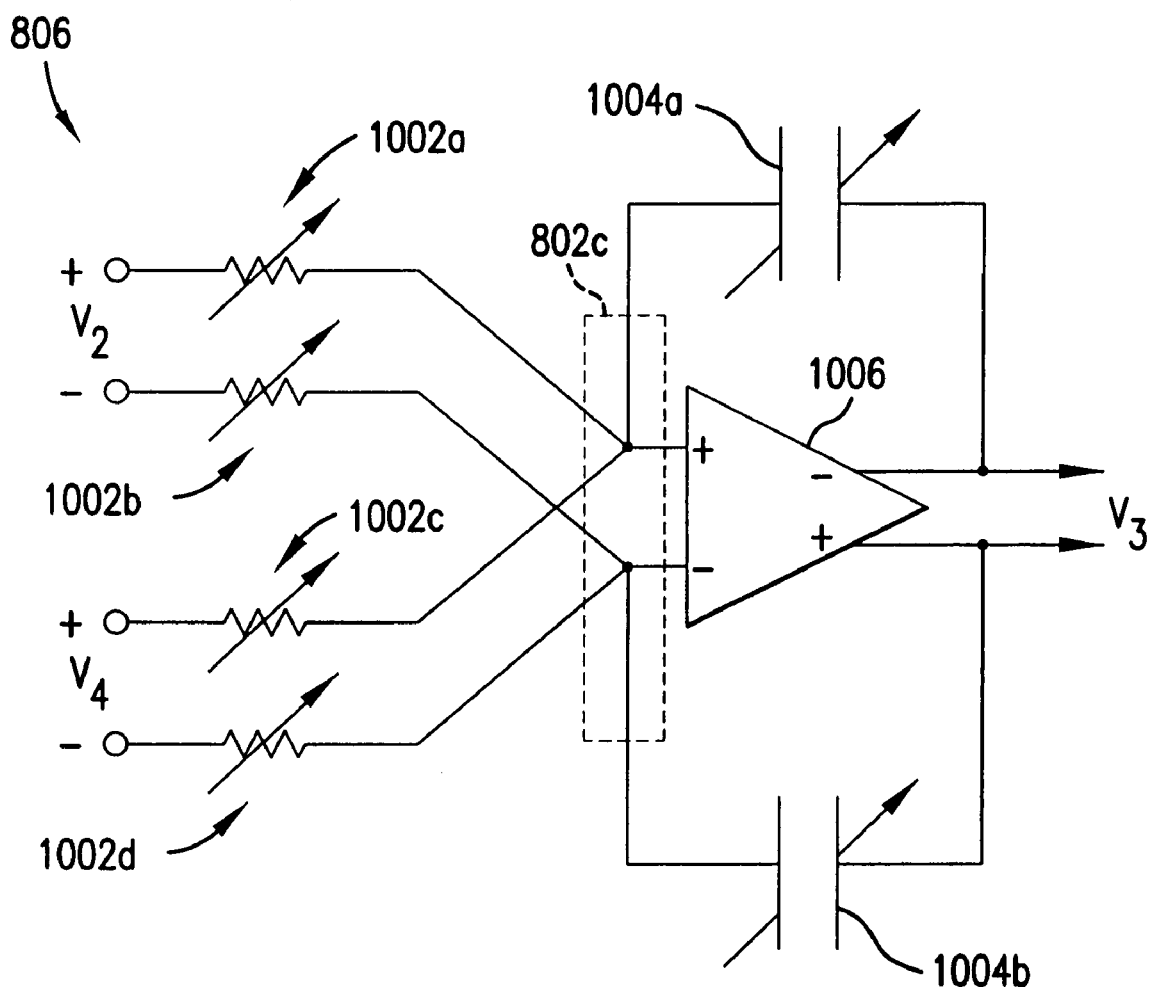

FIG. 10 illustrates an active integrator stage of tunable bandpass filter in FIG. 8, according to embodiments of the present invention.

Figure 11:
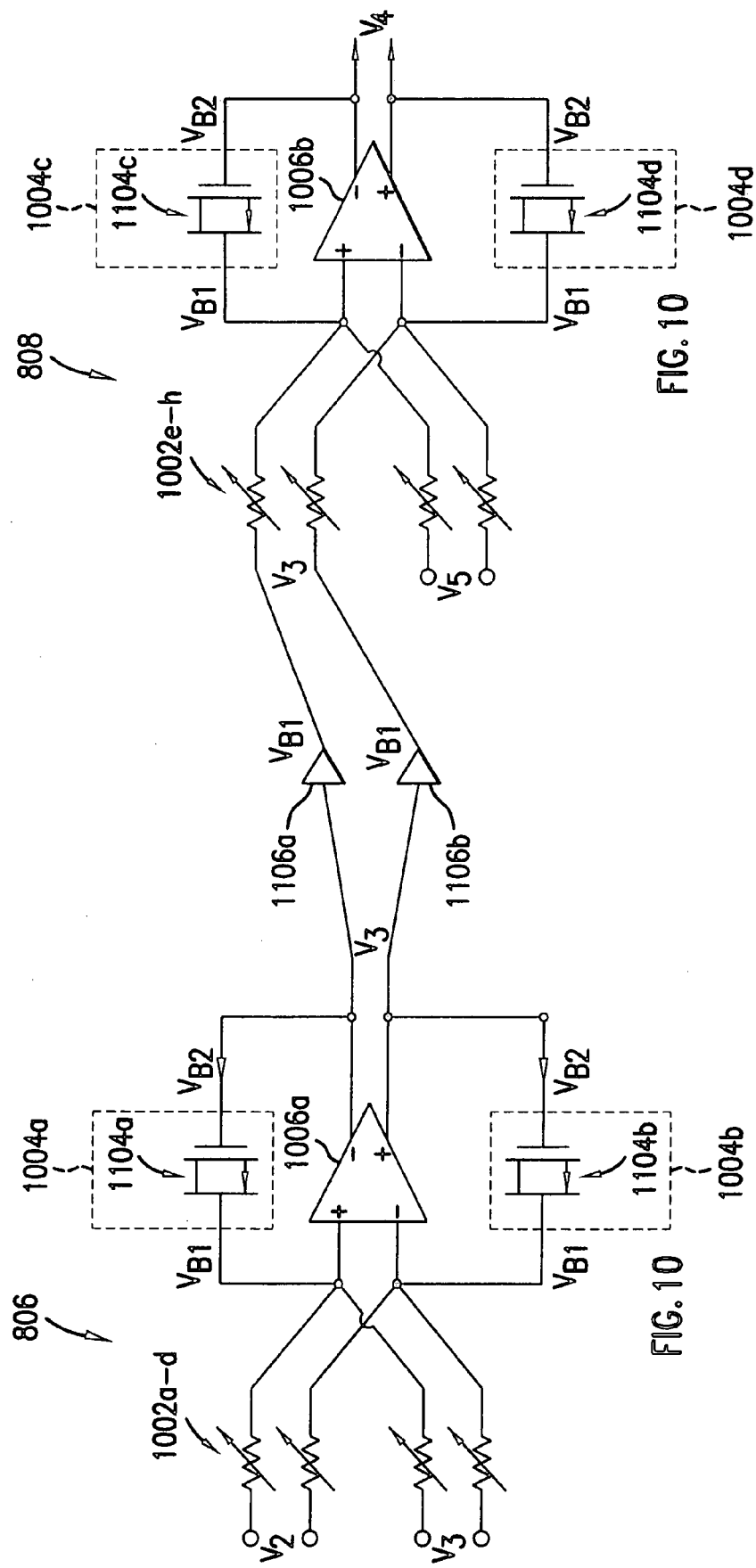

FIG. 11 illustrates level shifting between two active integrator stages in the tunable bandpass filter of FIG. 8, according to embodiments of the present invention.

Figure 12:
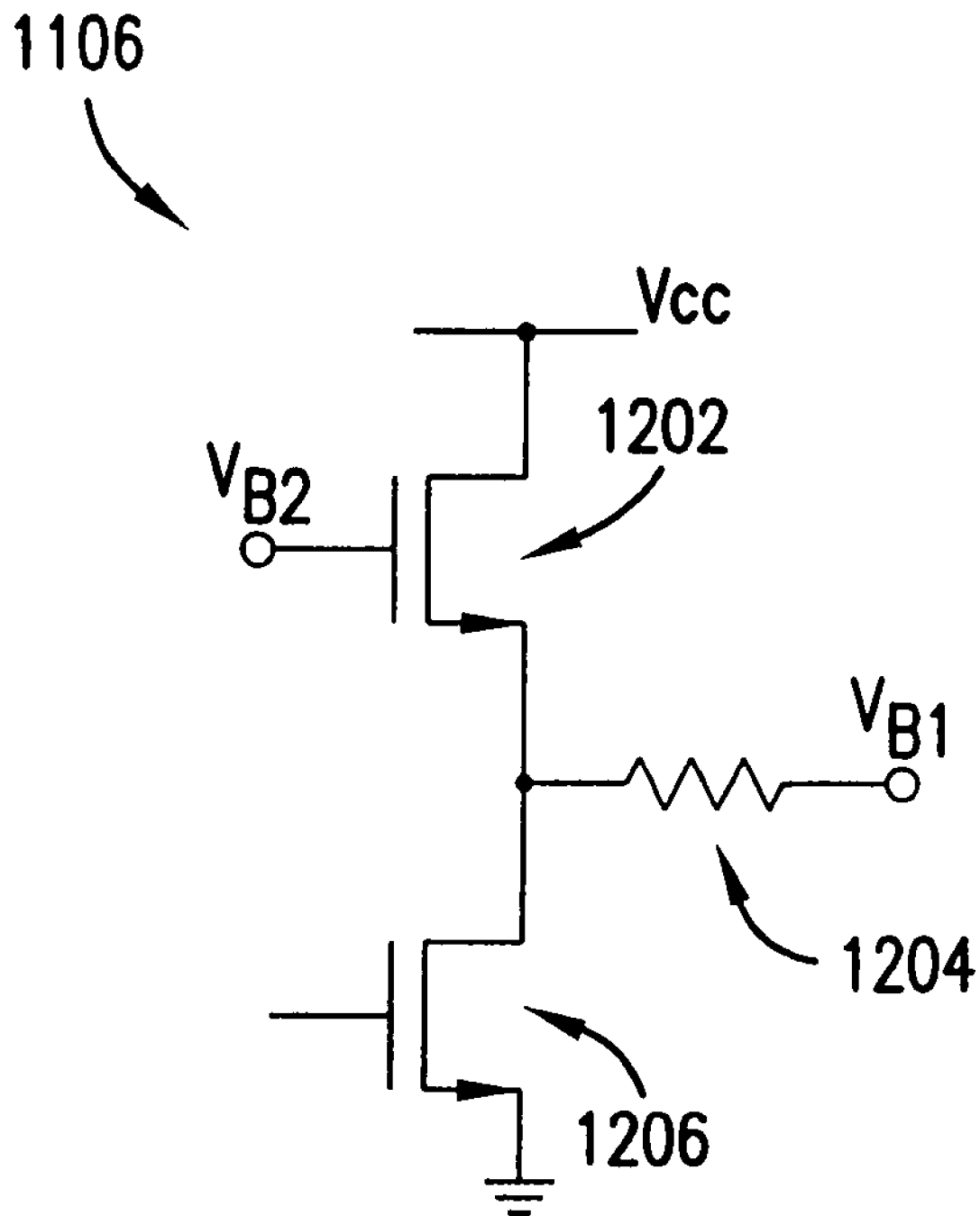

FIG. 12 illustrates a level shifting circuit, according to embodiments of the present invention.

Figure 13:
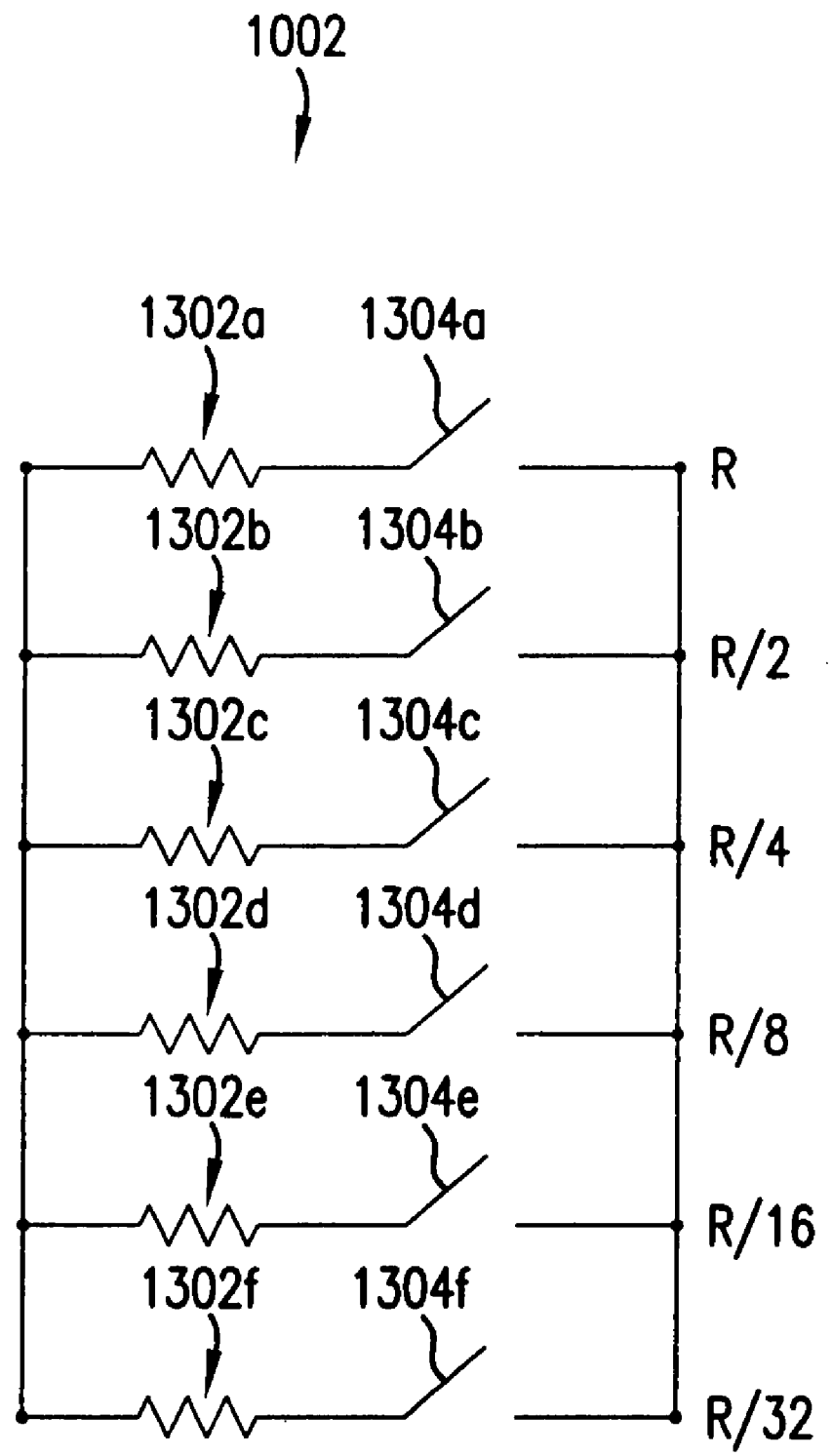

FIG. 13 illustrates a tunable resistor that is used to tune the cutoff frequency of the tunable filter in FIG. 8, according to embodiments of the present invention.

Figure 14:
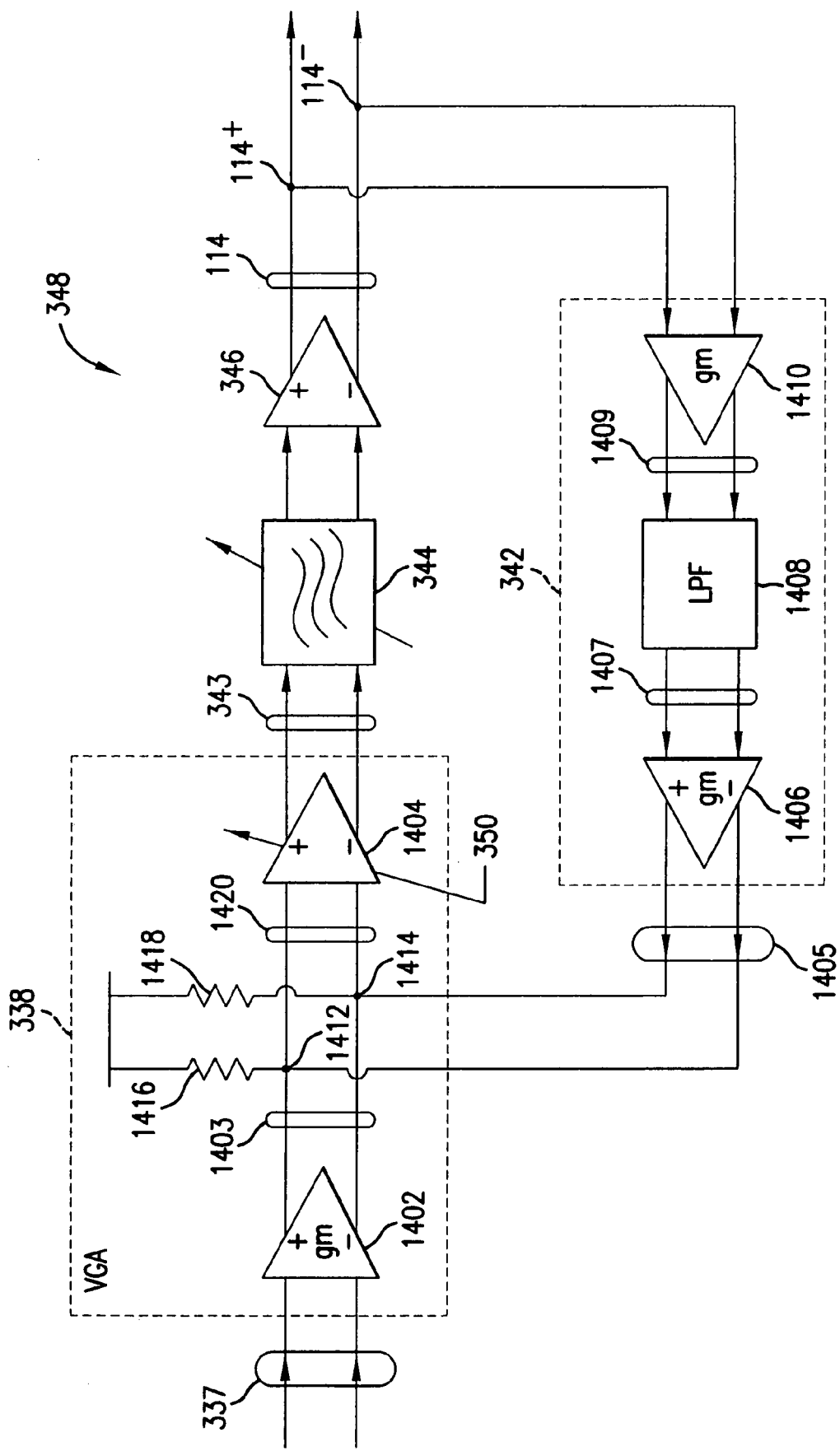

FIG. 14 illustrates a DC compensation circuit that eliminates DC offset according to embodiments of the present invention.

Figure 15:
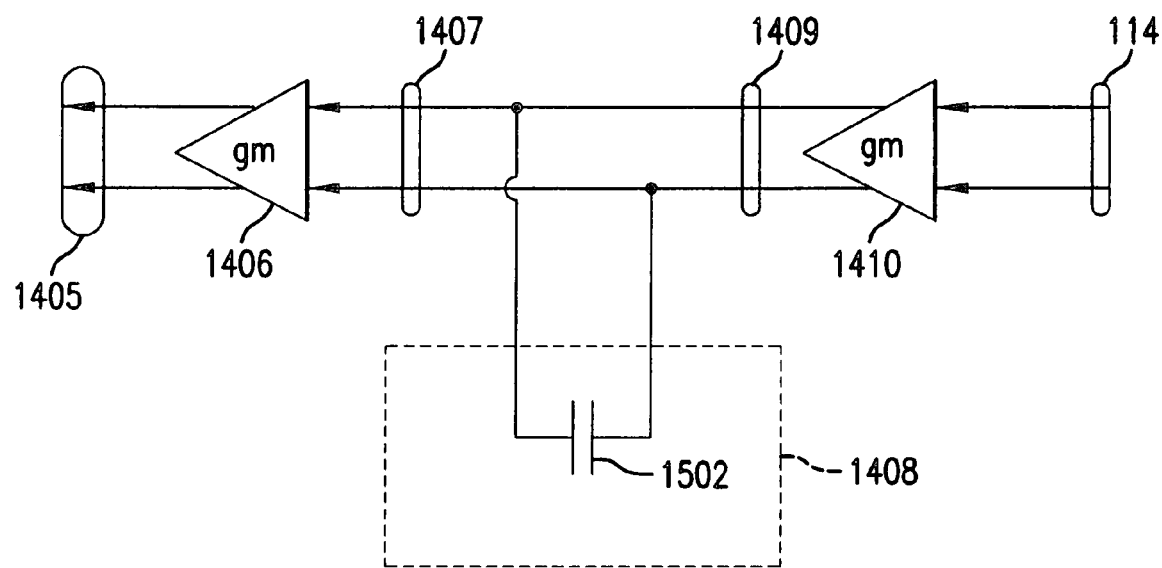

FIG. 15 further illustrates a lowpass filter that has as an external capacitor in the DC servo feedback loop of the DC compensation circuit.

Figure 16:
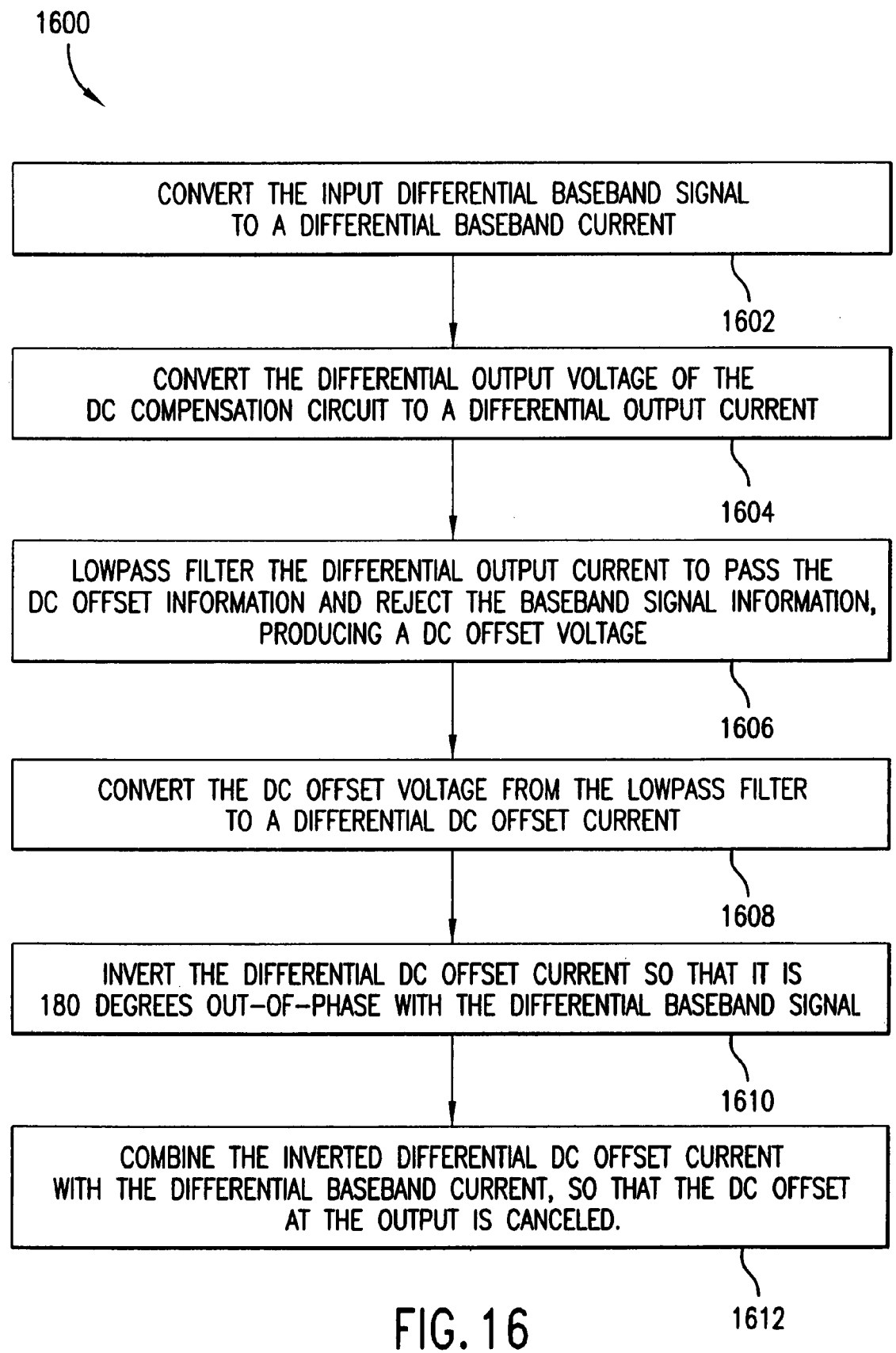

FIG. 16 illustrates a flowchart 1600 that describe the operation of the DC servo loop according to embodiments of the present invention.

Figure 17:
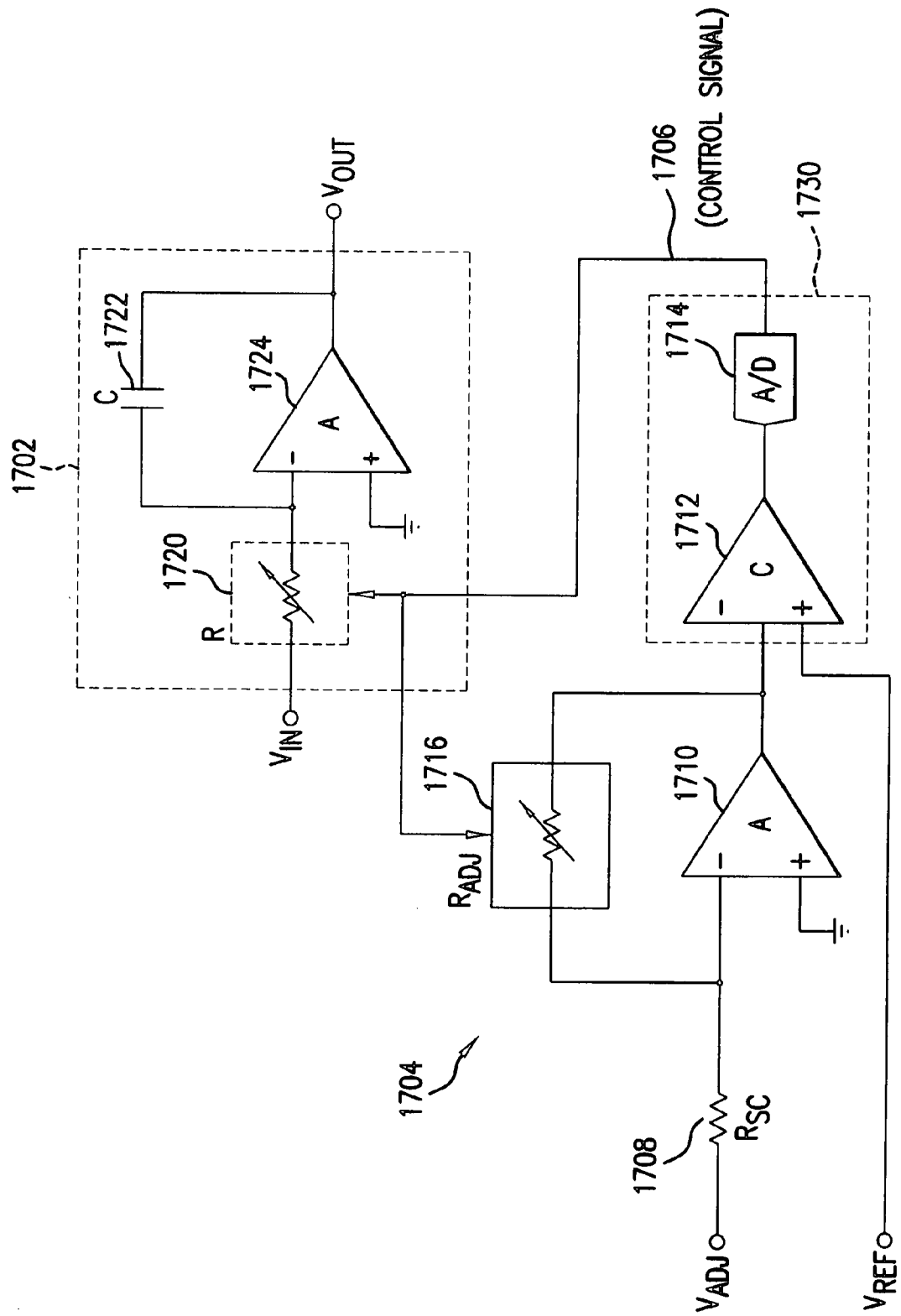

FIG. 17 illustrates a filter tuning and compensation circuit associated with the lowpass baseband filter, according to embodiments of the present invention.

Figure 18:
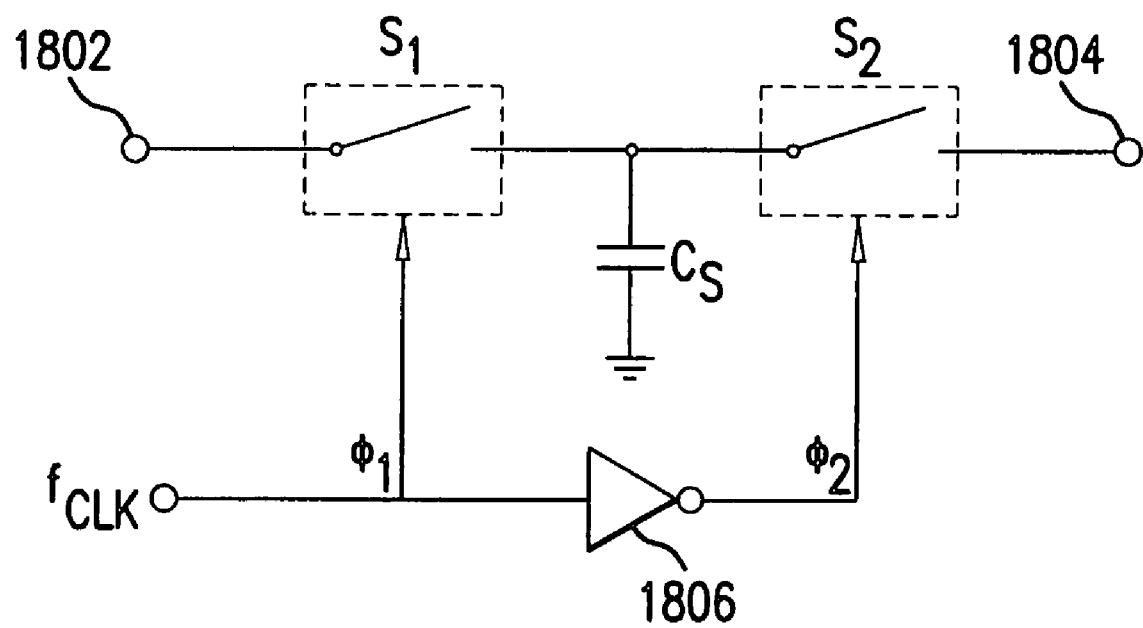

FIG. 18 illustrates a switched capacitor that is used in the filter tuning and compensation circuit of FIG. 17, according to embodiments of the present invention.

Figure 19:
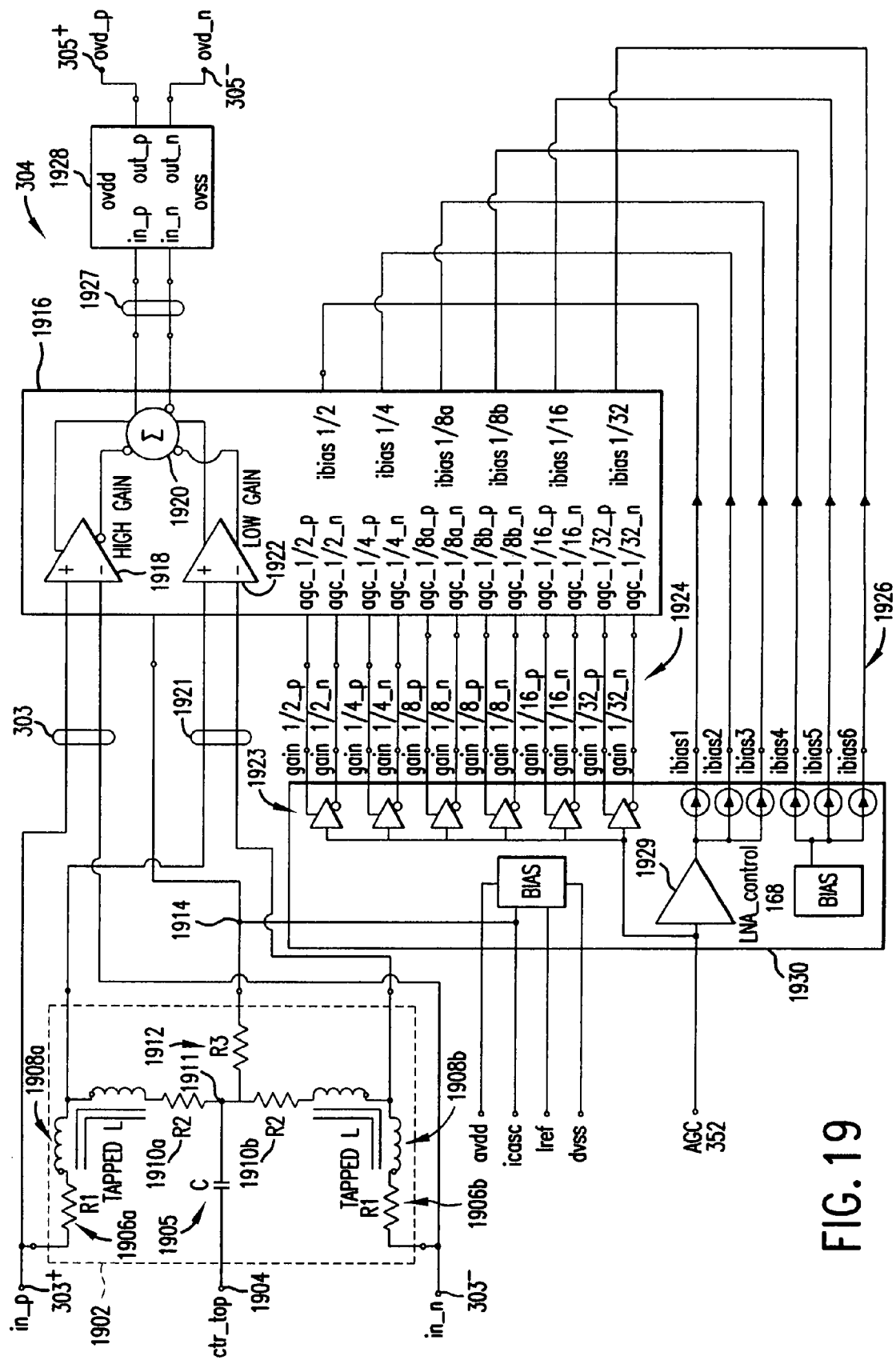

FIG. 19 illustrates a low noise amplifier according to embodiments of the present invention.

Figure 20:
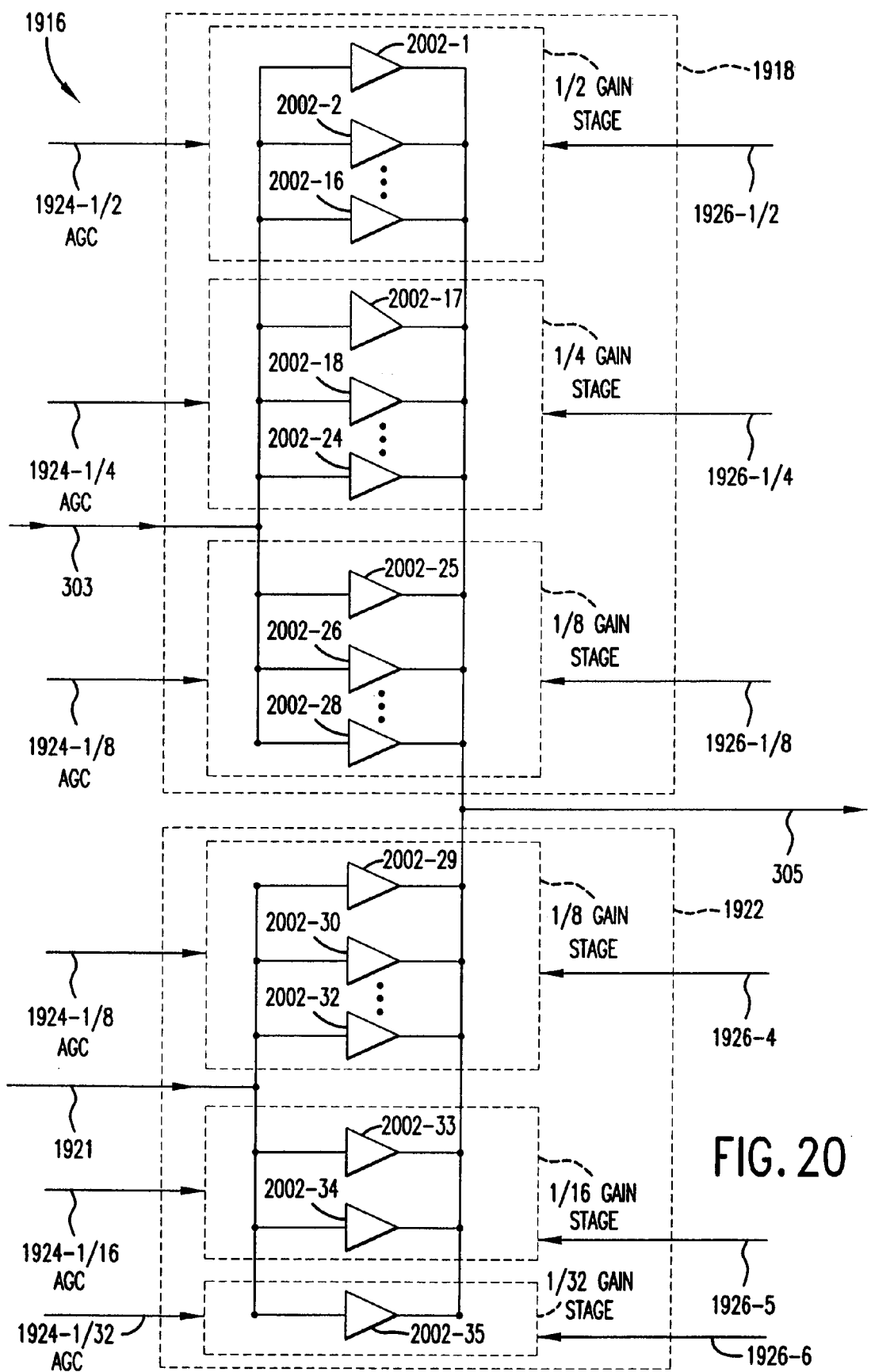

FIG. 20 illustrates a high gain stage and a low gain stage in the low noise amplifier according to embodiments of the present invention.

Figure 21:
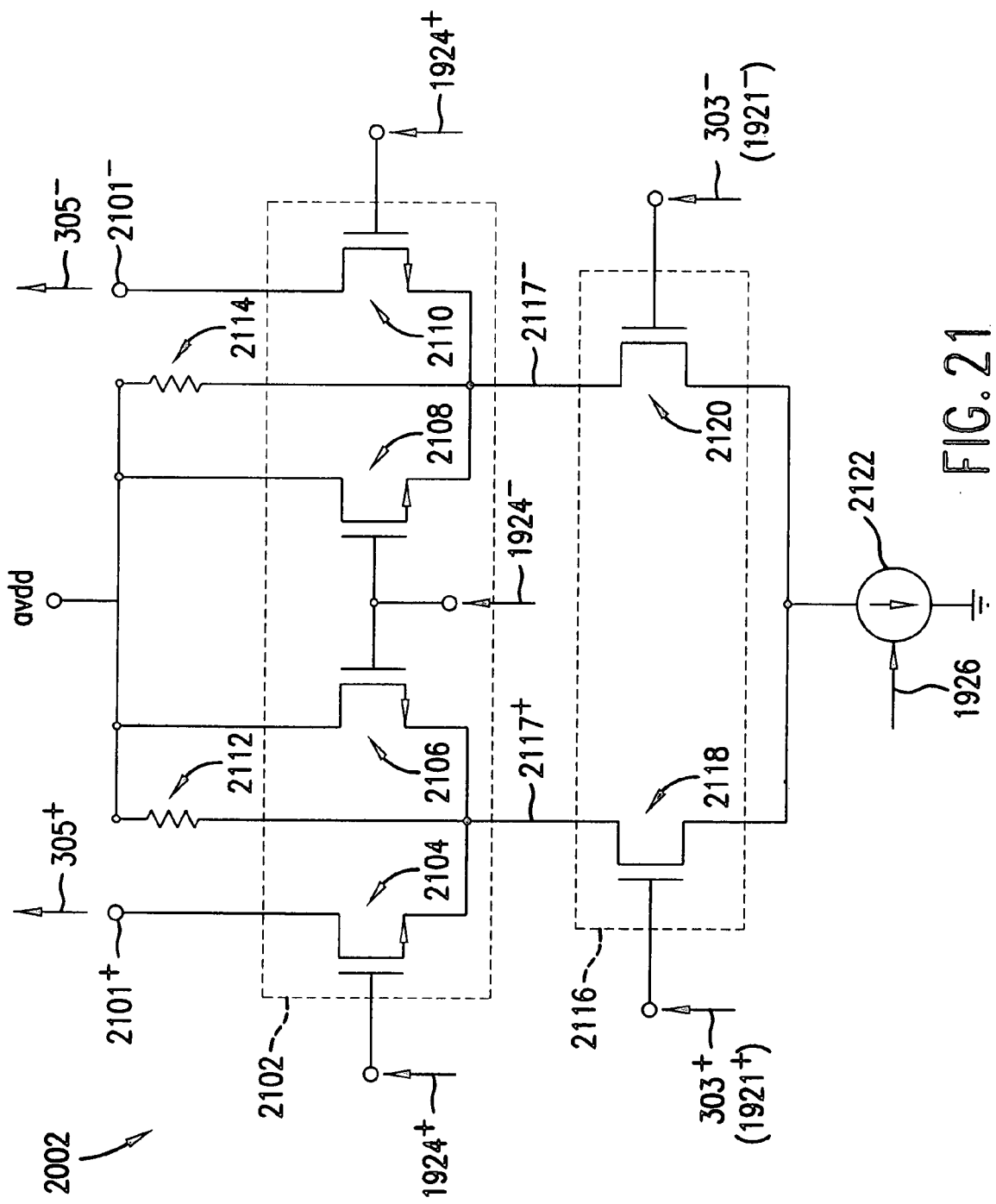

FIG. 21 illustrates a unit gain amplifier that is repeated in the high gain stage the low gain stage of the low noise amplifier according to embodiments of the present invention.

Figure 22:
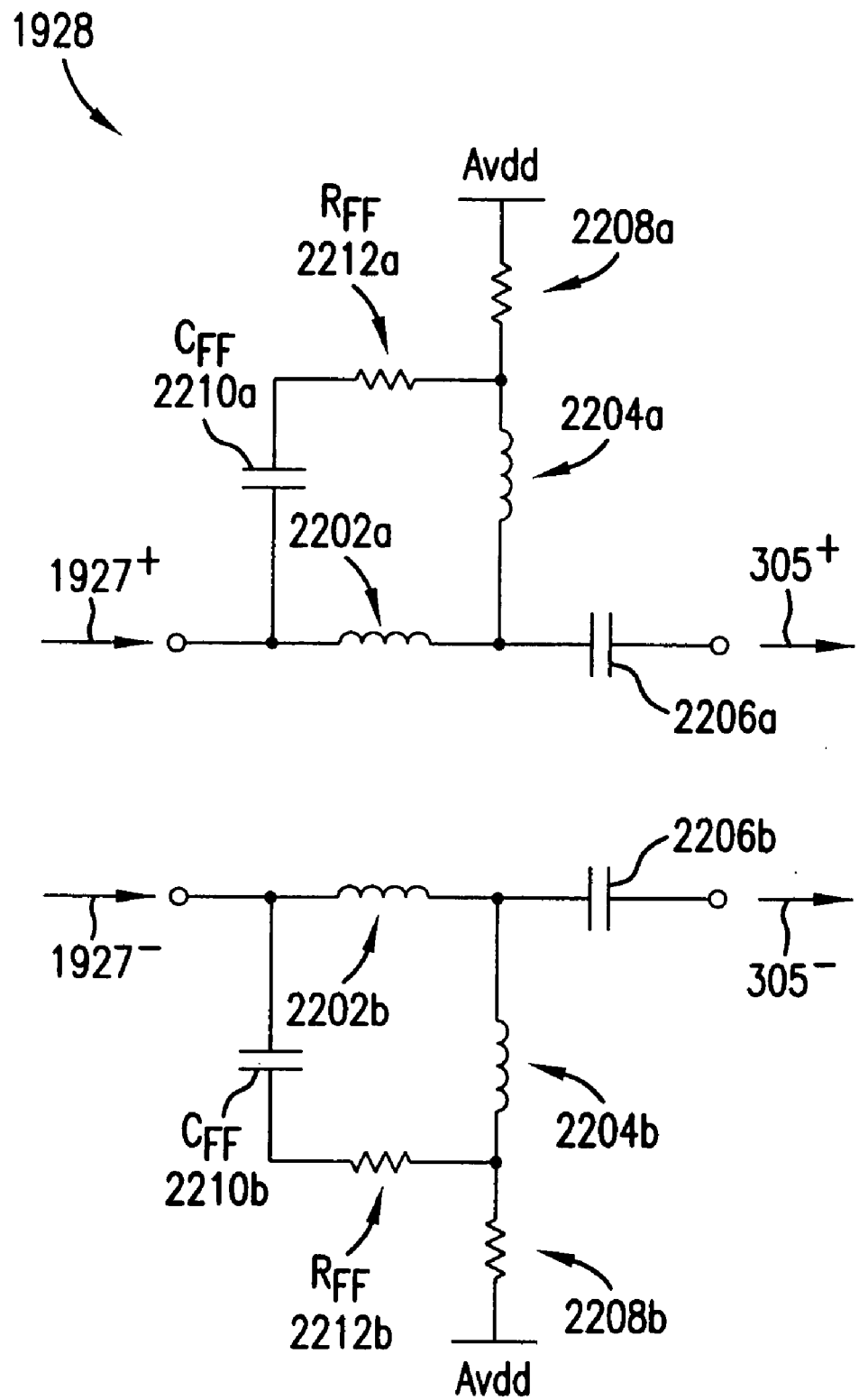

FIG. 22 illustrates a matching circuit for the low noise amplifier according to embodiments of the present invention.

Figure 23:
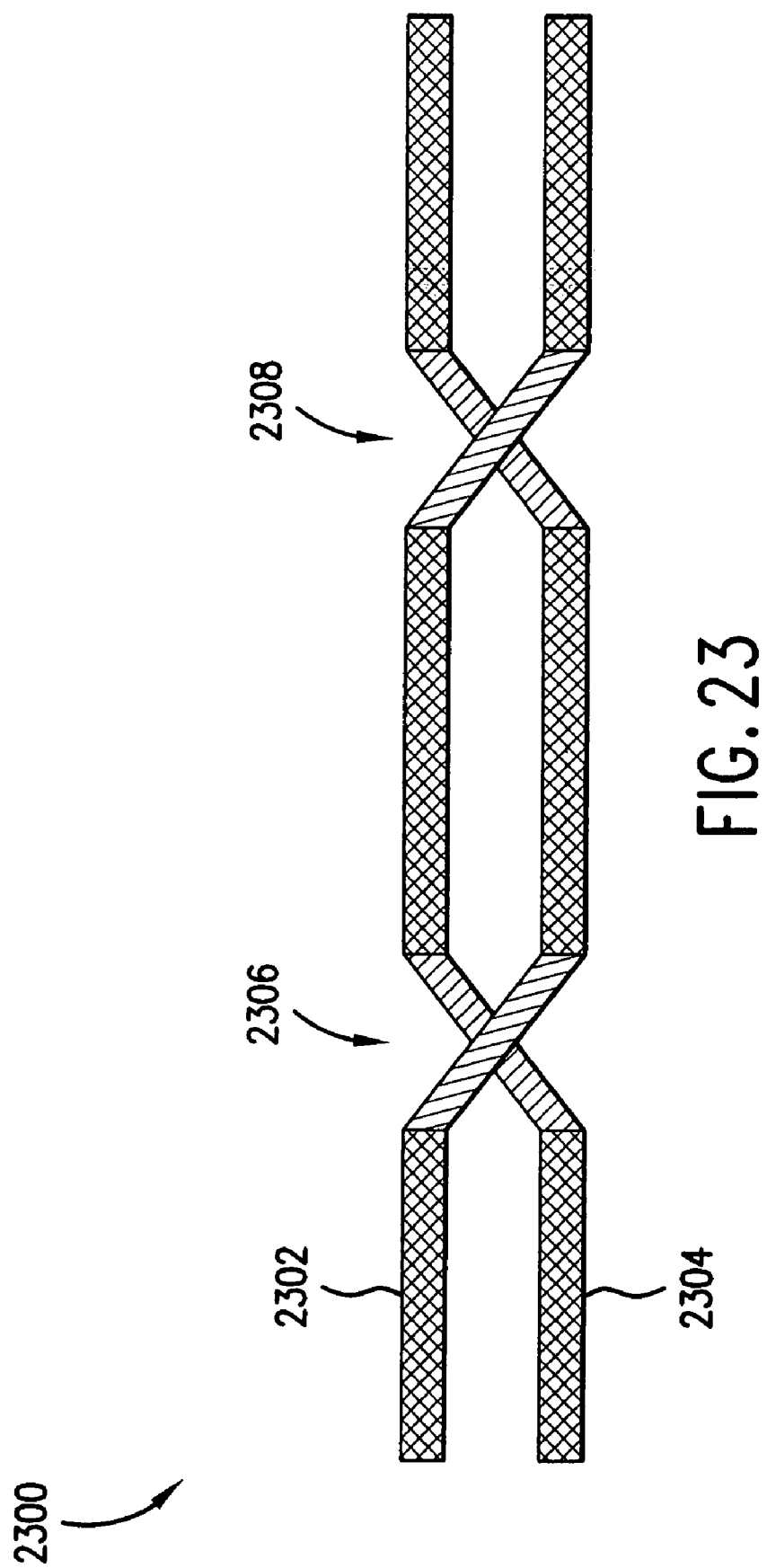

FIG. 23 illustrates a top view of a CMOS twisted pair according to embodiments of the present invention.

Figure 24:
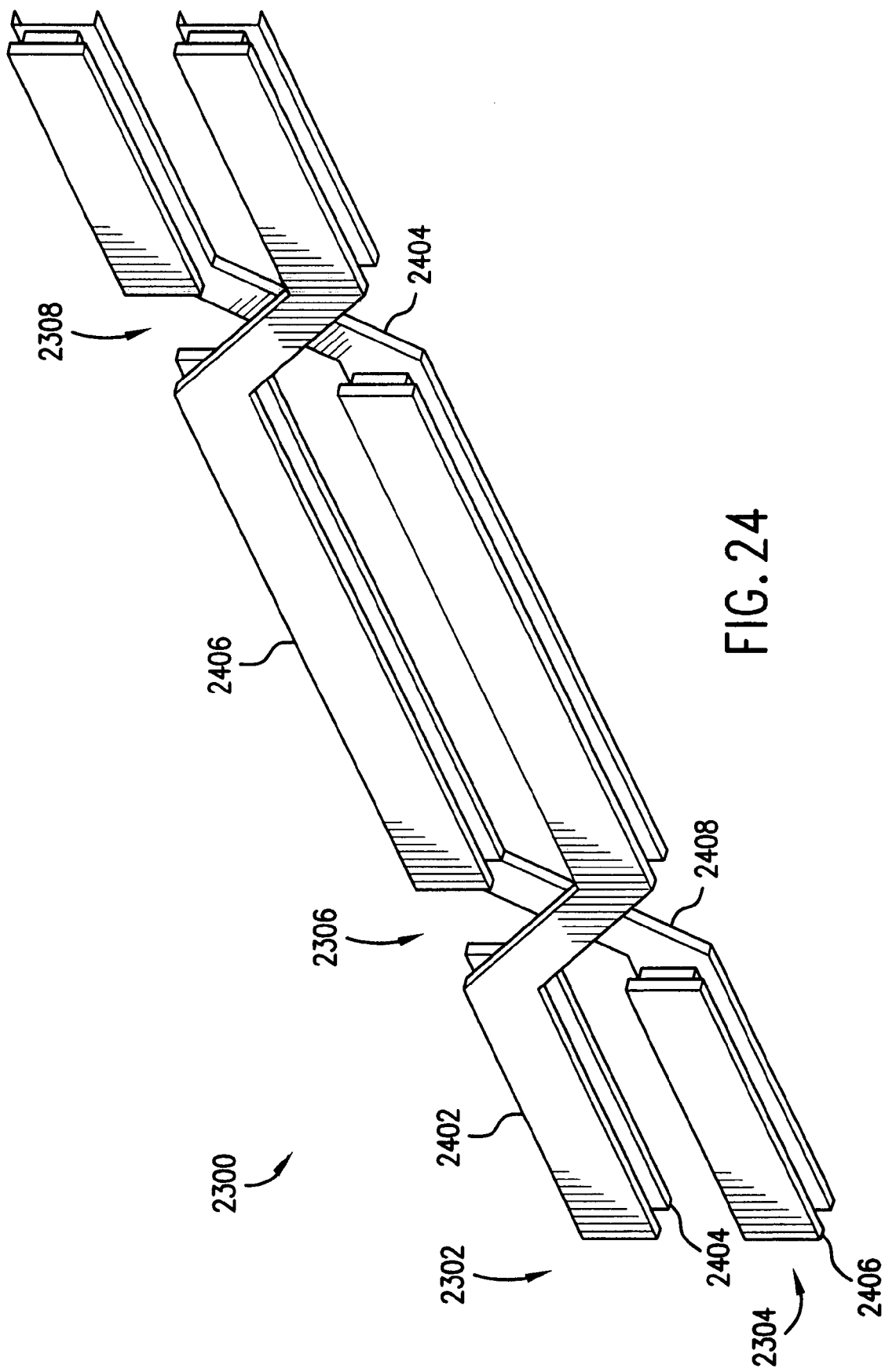

FIG. 24 illustrates an isometric view of a CMOS twisted pair according to embodiments of the present invention.

DETAILED DESCRIPTION OF THE INVENTION

Example Environment

Before describing the invention in detail, it is useful to describe an example satellite environment for the invention. The invention is not limited to the satellite environment that is described herein, and is applicable to other satellite and non-satellite applications as will be understood by those skilled in the relevant arts based on the discussions given herein.

Figure 1:
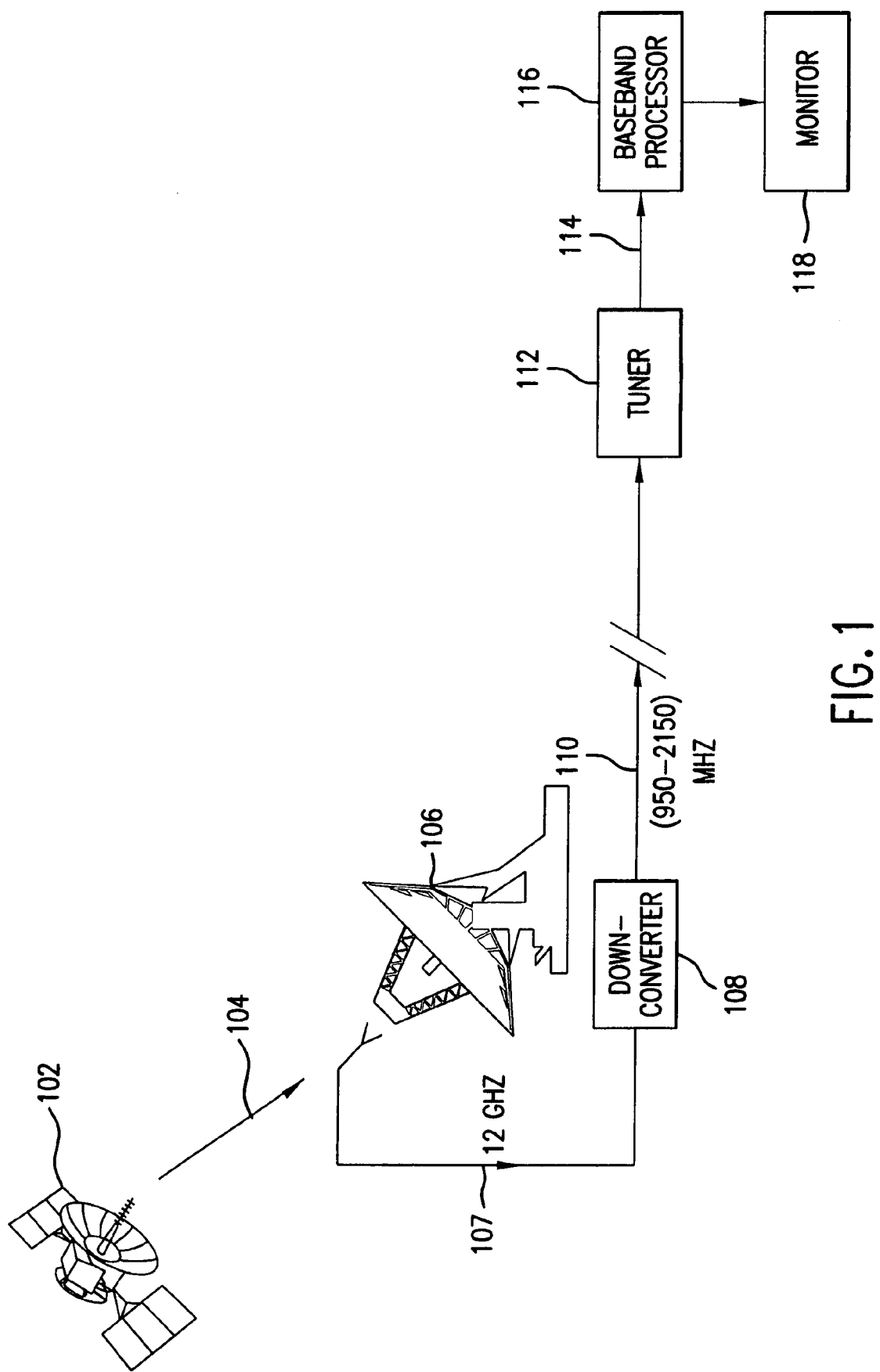
FIG. 1 illustrates a direct satellite TV environment.

FIG. 1 illustrates a direct satellite TV environment 100. Referring to FIG. 1, a satellite 102 transmits a wireless signal 104 that carries TV programming information. An antenna 106 receives the wireless signal 104 and generates an electrical signal 107. For satellite TV, the signal 104 is exemplarily operated at 12 GHz and therefore the signal 107 is also at 12 GHz. The down-converter 108 receives the signal 107 and down-converts the signal 107 to generate a signal 110, where the signal 110 occupies a bandwidth of 950-2150 MHz. A tuner assembly 112 receives the signal 110 and down-converts a selected channel in the signal 110 to baseband so as to produce a baseband signal 114. A baseband processor 116 processes the baseband signal 114 for display on the monitor 118. In embodiments, the monitor 118 is a TV, computer, or other display device. Furthermore, the monitor 118 can include an MPEG decoder, which is known to those skilled in the arts.

In a typical satellite TV environment, the antenna 106 is located outside so the antenna 106 has a clear line-of-site to the satellite 102. The down-converter 108 (also called a low-noise block) is located directly approximate to the antenna 106 so to as the immediately down-convert the 12 GHz signal to the lower frequency range of 950-2150 MHz, and thereby minimizes signal loss at the higher frequency 12 GHz frequency. The tuner 112 is located some distance away from the antenna 106, typically in an enclosed structure (e.g. residence) and is connected to the down-converter 108 via a coaxial cable, or other equivalent transmission medium.

Figure 2:
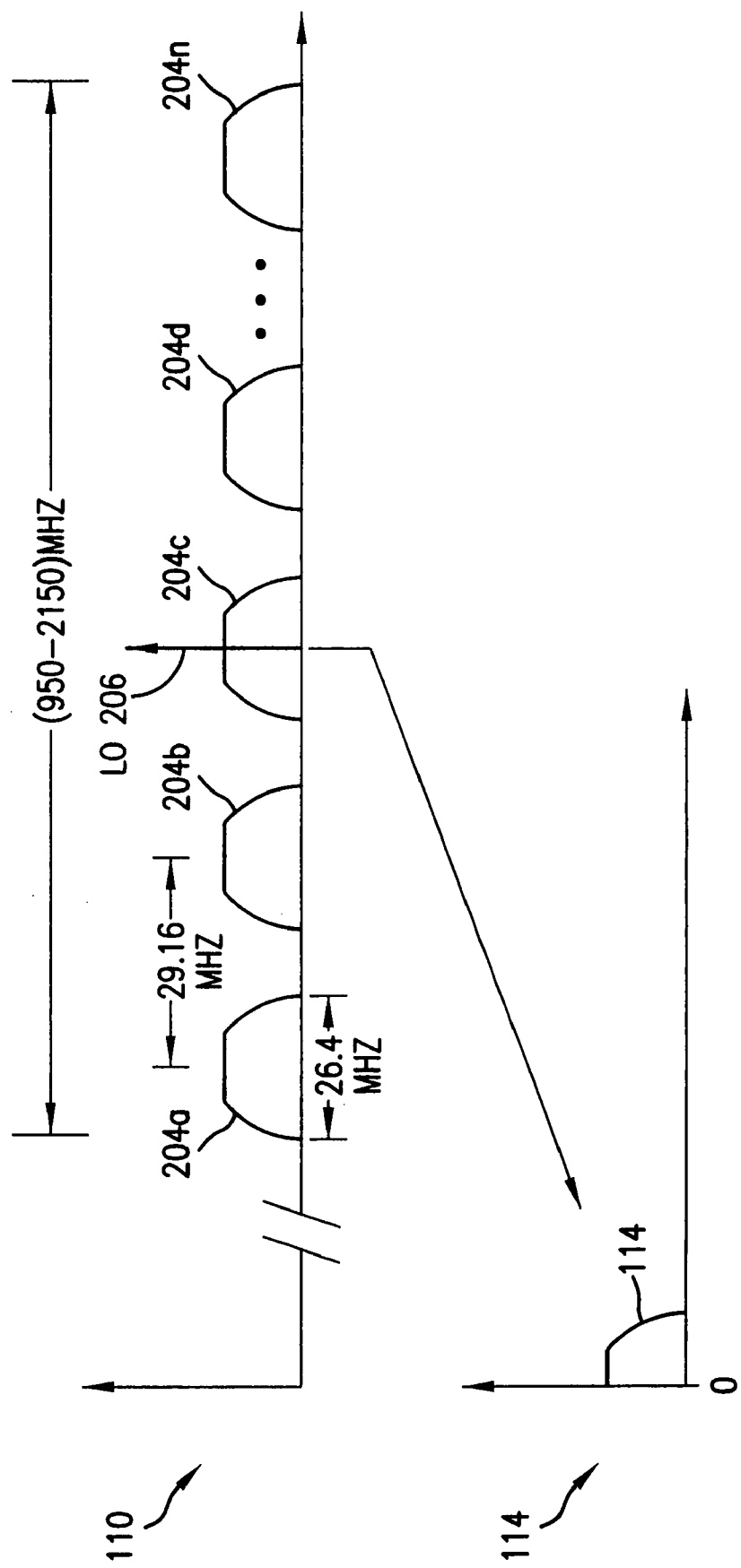
FIG. 2 illustrates down-conversion of a selected channel in the spectrum associated with the direct satellite TV environment that is described in FIG. 1.

FIG. 2 further illustrates the frequency translation performed by the tuner 112. Referring to FIG. 2, the spectrum 110 contains multiple channels 204a-n that occupy from 950-2150 MHz. A local oscillator signal 206 is tuned to the center of a selected channel 204, which could be any of the channels 204 in the signal 110. In FIG. 2, the selected channel is the channel 204c for example purposes. The tuner 112 down-converts the selected channel 204 directly to baseband, or approximately 0 Hz. In embodiments of the invention, the tuning step size of the LO 206 is relatively coarse, which causes the signal 114 to be shifted off of 0 Hz, by up to 2 MHz. This frequency shift off of 0 Hz for the signal 114 can be detected and compensated for by the baseband processor 116.

Integrated Tuner

Figure 3:
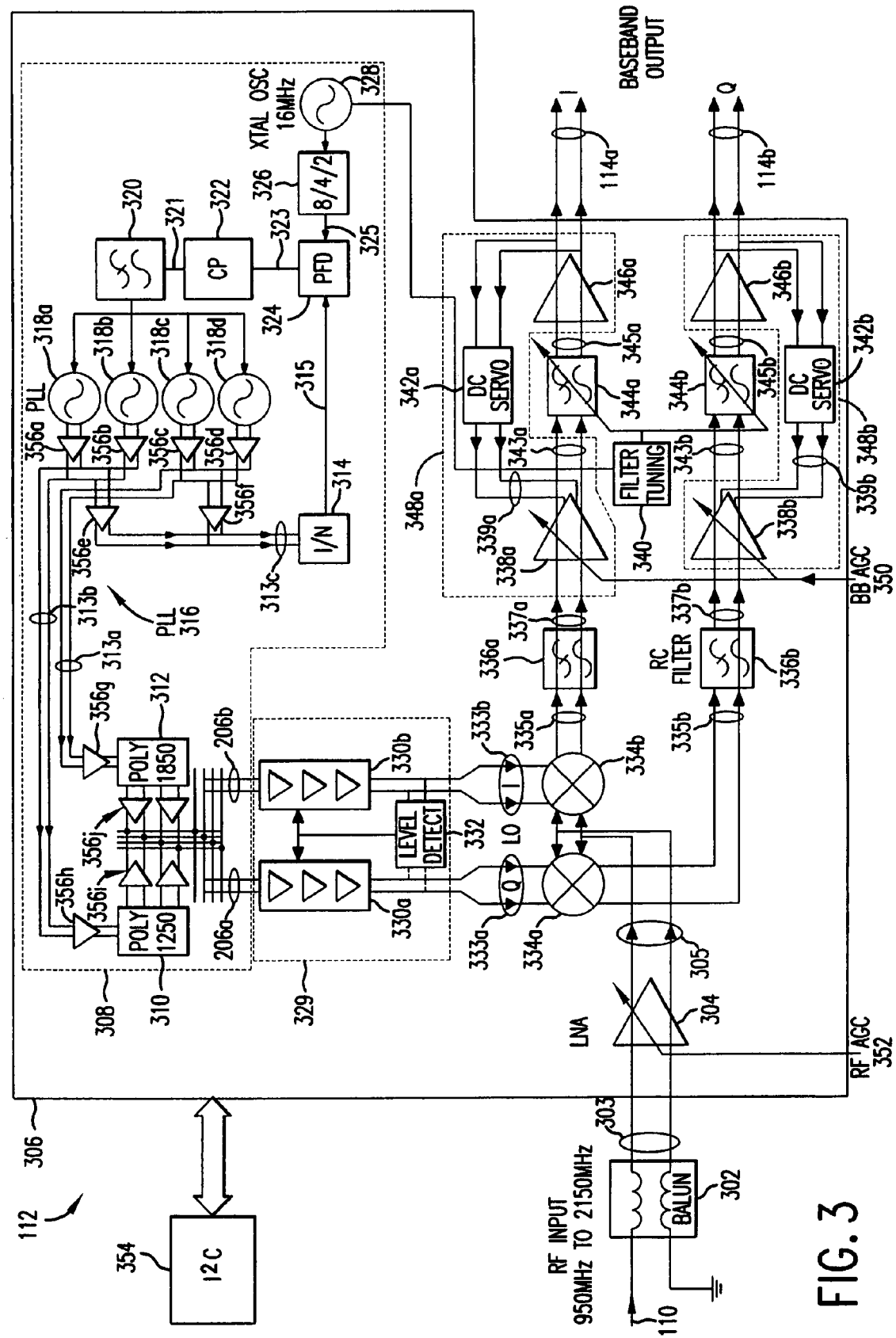
FIG. 3 illustrates an integrated direct conversion tuner according to embodiments of the present invention.

FIG. 3 illustrates the tuner assembly 112 in further detail. The tuner assembly 112 includes a balun 302, and a tuner 306. The balun 302 receives the signal 110, which is single-ended because the antenna 106 and corresponding cable is single-ended. The balun 302 converts the single-ended RF signal 110 to a differential RF signal 303. The tuner 306 receives the differential RF signal 303 and down-converts a selected channel (e.g. channel 204c in FIG. 2) to baseband frequencies. The selected channel is down-converted in an IQ format, represented by I and Q baseband signals 114a and 114b. The operation of the tuner 306 is described in further detail below.

The tuner 306 is fully integrated on a single semiconductor substrate using standard semiconductor processes, such as CMOS. As such there is no need for assembling multiple different semiconductor substrates. Unlike conventional tuners, both the local oscillator (LO) and the baseband filtering functions are performed on-chip, representative of the full integration. Furthermore, the bandpass filter tuning is also performed on-chip. Furthermore, in embodiments of the invention, the tuner 306 is completely differential, thereby improving phase noise performance and facilitating the mitigation of unwanted common mode voltages and DC offset.

The tuner 306 includes a LNA 304, a LO generator 308, a LO correction circuit 313, IQ mixers 334a and 334b, fixed baseband filters 336a and 336b, and DC offset compensation circuits 348a and 348, and tunable baseband filters 344a and 344b. One or more of these components can be tuned using an I²C interface 354. The tuner 306 is further described as follows.

The LNA 304 receives the differential RF signal 303 from the off-chip balun 302. The LNA 304 variably amplifies the differential RF signal 303 according to an RF AGC control 352, to produce a differential RF signal 305. The differential RF signal 305 is forwarded to the RF input of the IQ mixers 334 for down-conversion.

The LO generator 308 generates an in-phase (I) local oscillator (LO) signal 206a and a quadrature (Q) local oscillator (LO) signal 206b, collectively referred to as the LO signals 206. As will be understood, the LO signals 206a and 206b have a quadrature phase relationship and are differential. The frequency of the LO signals 206 is tuned to down-convert the selected channel in the signal 110 to baseband. As shown in FIG. 2, the frequency of the LO 206 is determined so that it is substantially in the middle of the channel 204 that is to be down-converted to baseband. The frequency of the LO signals 206 can be externally controlled using the I²C interface 354 to adjust the output frequency of a PLL 316 in the LO generation 308, as will be discussed further below.

LO correction circuit 313 receives the LO signals 206 and adjusts the amplitude to a predetermined level, so as to produce LO signals 333. The amplitude of the LO signals 333 is adjusted to improve or maximize the electrical performance of IQ mixers 334. More specifically, amplifiers 330a and 330b variable amplify the respective LO signals 206a and 206b according to a feedback signal from the level detect 332. The level detect 332 detects the amplitude level at the output of the variable amplifiers 330, and generates the feedback signal that controls the gain of the amplifiers 330, so as to produce a desired peak-to-peak voltage level at the output of the amplifiers 330. The peak-to-peak voltage level is externally controlled via the I²C interface 354. In one embodiment, the peak-to-peak voltage is set to 1 volt peak-to-peak, but other peak-to-peak voltages could be chosen.

In one embodiment, each amplifier 330 includes multiple field effect transistor (FET) amplifiers. The feedback signal from the level detect 332 controls the current of at least one of the FET amplifiers so as to control the gain of the respective FET amplifier, and thereby controls the signal level of the corrected LO signals 333.

IQ mixers 334 receive the corrected LO signals 333 and differential RF signal 305. Mixer 334a mixes the differential RF signal 305 with the I corrected LO signal 333a, to produce an I baseband signal 335a. Mixer 335b mixes the differential RF signal 305 with a Q corrected LO signal 333b, to produce a Q baseband signal 335b. As stated above, the frequency of the LO signals 333 is configured so that a selected channel in the differential RF signal 305 is down-converted directly to baseband. In one embodiment, each of the mixers 334 is a modified differential Gilbert cell mixer, the configuration and operation of which will is described further in following sections.

In addition to generating the baseband signal, the mixers 334 also up-convert the RF signal 305 to a sum frequency, which falls at $f_{LO}+f_{RF}$. The sum frequency occurs at approximately twice the frequency $f_{LO}$, since the $f_{LO}$ is selected to be equal to the selected channel in the RF signal 305. The lowpass filters 336a and 336b substantially reject the sum frequency in the respective I baseband signal 335a and the Q baseband signal 335b. However, the lowpass filters 336a,b pass the baseband frequencies ($f_{RF}-f_{LO}$) from the respective I and Q signals 335a and 335b, to produce I and Q baseband signals 337a and 337b. In embodiments, the filters 336 also remove some of the unwanted channels that were not down-converted to baseband, which produces lower distortion in stages that follow.

Baseband AGC amplifiers 338a,b receive the respective I and Q baseband signals 337a,b. The AGC circuit 338a variably amplifies the I baseband signal 337a according to a baseband AGC signal 350, to produce a baseband signal 343a. Likewise, the AGC circuit 338b variably amplifies the Q baseband signal 337b according to the baseband AGC signal 350, to produce a baseband signal 343b.

The RF AGC 304 and the baseband AGC 338 operate as a dual AGC to control the amplitude of the I and Q baseband signals 114. Preferably, the RF AGC 304 is configured to maintain a low noise figure, when compared to that of the baseband AGCs 338. When receiving an RF signal 303 having a relatively high level, the gain of the baseband AGCs 338 is reduced prior to the gain of the RF AGC 304. This is done to maximize the signal-to-noise performance of the baseband output signals 114.

Baseband filter 344a lowpass-filters the I baseband signals 343a to remove unwanted frequencies, producing baseband signal 345a. Likewise, baseband filter 344b lowpass-filters the Q baseband signal 343b to remove unwanted frequencies, producing baseband signal 345b. The baseband filters 334 are tunable, where their lowpass cutoff frequency is determined by a tuning control circuit 340. In embodiments of the invention, the lowpass cutoff frequencies are tunable from 2 MHz to 36 MHz. It is advantageous to have a tunable baseband filter on-chip because the baseband channel bandwidth for satellite television reception can even vary from one service provider to another. Therefore, by having a tunable baseband filter on-chip, a single tuner design can be mass-produced without prior knowledge of the service provider(s) and their respective baseband channel bandwidth requirements.

Buffer amplifier 346a receives the I baseband signal 337a and amplifies the baseband signal 345a to produce the I baseband signal 114a. Likewise, the amplifier 346b receives the Q baseband signal 337b and amplifies the Q baseband signal 345b to produce the Q baseband signal 114b.

As discussed herein and illustrated in FIG. 3, the tuner 306 is configured to be completely differential, which improves electrical performance, including phase noise performance. However, in differential configurations, DC offsets can occur between the positive and negative components of the differential signal. DC offsets are caused by component mismatches that are along a receiver chain. Without compensation, these DC offsets can saturate the baseband components, thereby preventing proper reception of the desired channel. One way to remove DC offset is to AC couple the receiver components. For example, the RF AGCs 338a and 338b could be AC coupled to the respective output of the filters 336a and 336b using capacitors. However, this is problematic at baseband frequencies because the capacitors would have to be very large and therefore hard to implement on-chip.

Hence, DC compensation circuits 348a and 348b remove the DC offsets from the respective I and Q baseband signals 114a and 114b using a subtractive feedback technique, without the need for series capacitors. More specifically, a DC servo circuit 342a senses the output of the amplifier 346a and determines an average 339a for any DC offset in the I baseband signal 114a. The average DC offset 339a is inverted and is fed back to the output of the amplifier 338a so as to cancel the DC offset at the output of the variable gain amplifier 338a, thereby removing any DC offset from I baseband signal 114a. A DC servo circuit 342b senses the output of the amplifier 346b and determines an average 339b for any DC offset in the Q baseband signal 114b. The average DC offset 339b is inverted and is fed back to the output of the amplifier 338b so as to cancel the DC offset at the output of the variable gain amplifier 338b, thereby removing any DC offset from Q baseband signal 114b.

Further details of the LO generation circuit 313, the IQ mixers 334, the DC compensation circuits 348, and the lowpass filters 344 are described below.

Local Oscillator Generation

The LO circuit 308 includes a phase lock loop (PLL) 316 and two polyphase circuits 310 and 312 to generate the I and Q LO signals 206a and 206b. The PLL 316 includes multiple VCOs 318a-d, where one VCO 318 is selected based on the desired frequency for the I and Q LO signals 206a,b. In one embodiment: VCO 318a covers the frequency range from 950-1250 MHz; VCO 318b covers the frequency range from 1250-1550 MHz; VCO 318c covers the frequency range from 1550-1850 MHz; and VCO 318d covers the frequency range from 1850-2150 MHz. The VCOs 318 are not limited to the mentioned frequency ranges as other frequency divisions may be possible.

The PLL 316 operates according to PLL feedback principles. More specifically, a VCO output 313c of the selected VCO 318 is fed back to a divider 314, which divides the frequency of the selected VCO 318 by 1/N, to produce a divider output 315. A phase detector 324 compares the divider output 315 of the divider 314 with a reference signal 325, and generates an error signal 323 that represents the phase or frequency difference between the two signals 315 and 325. The error signal 323 drives a charge pump 322 that generates an output current 321 that drives a loop filter 320. The loop filter 320 generate a voltage according to the charge pump current 321, which tunes the frequency of the selected VCO 318 to remove any frequency and/or phase difference between the output 313 and the reference signal 325. As such, the PLL 316 operates as a self correcting feedback loop that corrects any frequency and/or phase difference between the VCO output 313c and the reference signal 325.

The reference signal 325 is generated by a crystal oscillator 328 and a divider 326. The reference signal 325 determines when the phase detector 324 updates the error signal 323, and therefore determines the frequency resolution (or Δfreq change) in the output of the VCO output signal 313. There is an inverse relationship between frequency resolution and phase noise in a phase lock loop. The finer the frequency resolution, the higher the phase noise of the PLL 316. However, it is often desirable to have fine frequency resolution in a phase lock loop to produce an output signal frequency that is as accurate as possible. Hence, the programmable divider 326 allows for the optimization between these competing goals of phase noise and frequency control. In one embodiment, the oscillator 328 is a 16 Mhz oscillator, and the programmable frequency divider 326 is capable of dividing the output of the crystal oscillator 328 by factors of either 8, 4, or 2. If the divider 326 is set to 2, then the frequency of the VCO output 313 varies in 8 MHz steps. If the divider 326 is set to 8, then the frequency of the VCO output 313 varies in 2 MHz steps, allowing for finer frequency control than for the divide-by-two selection. However, the phase noise is worse for the divide by 8 selection because there is a longer time period between the time that the error signal 323 is updated.

As stated herein, the frequency of the local oscillator 206 is tuned to select the channel in the RF signal 305 that is down-converted to baseband. Once the VCO 318 is selected, the frequency of the selected VCO 318 can be further tuned by adjusting either the reference signal 325 or the divider ratio of the divider 314. The tuning instructions can be received using the I$^2$C bus 354 to adjust either the reference signal 325, the divider 314, or some other way of tuning the PLL 308.

In addition to being fed to the divider 314, the output of the selected VCO 318 is fed to one of the polyphase circuits 310 and 312, over lines 313a or 313b. The polyphase circuit 310 covers the range from 950 to 1550 MHz, and is connected to the VCOs 318a and 318b by the differential lines 313b. The polyphase circuit 312 covers the range from 1550 MHz to 2150 MHz, and is connected to the VCOs 318c and 3189d over the lines 313a. As illustrated, multiple amplifiers 356a-h are also connected in series between the outputs of the VCOs 318 and the polyphase circuits 310 and 312. For example, amplifiers 356a-d are connected directly at the output of the PLL 318a-d, respectively. Furthermore, the amplifier 356h is connected in-series between the VCOs 318a,b and the polyphase circuit 310. Likewise, the amplifier 356g is connected in-series between the VCOs 318c,d and the polyphase circuit 312. Furthermore, the amplifier 356e is connected between the output of VCOs 318a and 318b and the divider 314. The amplifier 356f is connected between the output of the VCOs 318c and 318d and the divider 414. Furthermore, amplifiers 356i and 356j are connected to the output of the respective polyphase circuits 310, 312. The selection among the VCOs 318 is discussed further below.

In one embodiment, the selected VCO 318 is determined by controlling the power to amplifiers 356 using the I²C interface 354. In other words, some of the amplifiers 356 are turned-on and some of the amplifiers 356 are turned-off to connect the desired VCO 318 to the appropriate polyphase circuit, and to disconnect the remaining VCOs 318 from the polyphase circuits. For example, assuming that the VCO 318a is the selected VCO 318, then the amplifiers 356a and 356h are powered-up to connect the VCO 318a to the polyphase circuits 310. Additionally, the amplifier 356e is also turned-on to connect the VCO 318a to the divider 314. Additionally, the amplifier 356i is also powered up at the output of the polyphase circuit 310. The power to the remaining amplifiers 356 is turned-off and therefore no other VCO 318 (other than 318a) is connected to either the polyphase circuits 310 and 312, or to the divider 314. FIG. 4 continues the example for each of the VCOs 318 by providing a table 400 that defines the power state for the amplifiers 356 that is needed to enable a specified VCOs 318.

The polyphase circuit 310 receives the output 313b from the VCO 318a or the VCO 318b when one of these VCOs are active, and generates I and Q LO outputs 206a or 206b. Likewise, the polyphase filter 312 receives the output 313a from the VCO 318c or the VCO 318d when one of these are active, and the generates I and Q LO outputs 206a or 206b. FIG. 5 further illustrates the polyphase circuits 310,312. Referring to FIG. 5a, each polyphase circuit 310,312 includes a signal divider 502 and phase shifts(s) 504 that are configured so that one output 506 of the polyphase circuit is phase-shifted by 90 degrees with respect to the other output 508. The polyphase circuits 310, 312 operate over a limited bandwidth as the phase-shift 504 only provides an accurate 90 degree phase-shift over a limited frequency bandwidth. Hence the phase-shift 504 in the polyphase circuit 310 is optimized to operate over the frequency range of 950 to 1550 MHz, which corresponds with the frequency covered by the VCOs 318a and 318b. Similarly, the phase-shift 504 in the polyphase circuit 312 is optimized for a frequency range of 1550 to 2150 MHz, which corresponds with the frequency covered by the VCOs 318c and 318d. In one embodiment, the phase-shift 504 in the polyphase circuits 310,312 is optimized so that the quadrature phase error between the I and Q LO signals 206a and 206b is less than 2 degrees. In other words, the phase difference between the I and Q LO signals is 90 degrees +/−2 degrees across the designated frequency band.

FIG. 5B further illustrate path connections between the PLL 316 and the polyphase circuits 310 and 312. Of note in FIG. 5B, is that there are switches connected to the outputs of the VCOs 318 that are closed for the VCO that is selected for operation. Furthermore, the polyphase circuits 310,312 have 4 inputs (0, 180, 90, and 270 degrees) and 4 outputs (90, 180, 90, and 270 degrees). However, only the 0 and 180 degree inputs are utilized to receive the LO signal 313. The other 2 inputs, 90 and 270 degrees, can be either grounded or left open. The Inventors have found that grounding the 90 and 270 degree input provides better noise performance.

As discussed herein, four VCOs (318a-d) and two polyphase circuits (310 and 312) are used to cover the desired LO frequency range from 950 MHz to 2150 MHz. However, more or less VCOs and/or polyphase circuits could be utilized to cover the LO frequency range depending on the desired performance specifications, as will be understood by those skilled in the relevant arts. These other configurations that utilize a different number of VCOs and/or polyphase circuits are within the scope and spirit of the present invention.

Furthermore, the VCOs 318 are configured to operate over a frequency range of 950-2150 MHz. However, the present invention is not limited to operating over this frequency range. Other frequency ranges could be chosen as will be understood by those skilled in the arts based on the discussion given herein. These other frequency ranges are within the scope and spirit of the present invention.

Quadrature Mixers

As stated above, IQ mixers 334 down-convert the differential RF signal 305 directly to baseband by mixing with the differential RF signal 305 with the corrected LO signal 333. FIG. 6 further illustrates the I mixer 334a and the Q mixer 334b as a modified differential Gilbert cell mixer comprised of multiple FET transistors and variable current sources 602 and 604. The mixer 334 in FIG. 6 is described generically without regard to I and Q signals, as I/Q distinction only results in a 90 degree phase change between the relevant signals.

Referring to FIG. 6, an RF transconductance circuit 616 receives the differential RF signal 305 and converts the differential signal 305 to a differential current 622. More specifically, a FET 618 receives a positive voltage component $305^+$ of the differential RF signal 305 and converts it to an RF current $622^+$. Similarly, a FET 620 receives a negative voltage component $305^-$ and converts it to an RF current $622^-$. (Herein, the individual positive and negative components for differential signals are identified using "+" and "−" designations after the reference numbers.)

A switching circuit 606 receives the RF current 622 and commutates the RF current 622 according to the LO signal 333, to produce a baseband output 335. More specifically, FETs 608 and 610 commutate the RF current $I_1$ $622^+$ according to a positive component $333^+$ and a negative component $333^-$, respectively, of the LO signal 333. As result, the current RF current $I_1$ $622^+$ is switched between the outputs $335^+$ and $335^-$ at the clock rate of the LO signal 333. Similarly, FETs 612 and 614 commutate the RF current $I_2$ $622^-$ according to the positive component $333^+$ and the positive component $333^-$, respectively, of the LO signal 333. As result, the current RF current $I_1$ $622^-$ is switched between the outputs $335^+$ and $335^-$ at the clock rate of the LO signal 333. The sampling of the RF signal 622 at the rate of the LO signal 333 produces the signal mixing action and frequency translation. Since the frequency of the LO signal 333 is centered on a selected channel of the RF signal 305, the mixing action of the FETs 608-614 produces sum and difference frequencies at the outputs 335, where the difference frequency is at approximately baseband, depending on the accuracy of the LO signal 333.

In order to minimize the flicker noise, the FETs 618 and 620 should be operated at relatively high current flow in $I_1$ and $I_2$. Ignoring (for the moment) the variable DC current sources 602 and 604, the currents $I_1$ $622^+$ and $I_2$ $622^-$ flow through the respective FETs 608-614 in the switching circuit 606, which are controlled by the LO signal 333. If the current $I_1$ 62$^+$ and $I_2$ 622$^-$ are sufficiently large, then the LO signal 333 would also need to be large to switch FETs 608-614 completely on-and-off. Mixer gain would decrease and flicker noise would increase if the FET 608-614 do not turn completely "on" or completely "off" because of inadequate LO drive. However, there are limitations to the signal amplitude that is available from the LO correction circuit 329. Furthermore, the greater the current that flows through the FETs 608-614, the larger the devices need to be to handle this current. Larger FET devices have larger parasitic capacitance that reduces overall signal bandwidth. Thus, there is a trade-off between the desire to maximize the current flow 622 to minimize flicker noise in the FETs 608-614 and the desired to limit the LO drive requirement of the LO 333.

The variable current DC sources 602 and 604 are added to the mixer 334 to address the mentioned tradeoff between flicker noise and LO drive. The variable current sources add DC current to the signals $I_1$ 622$^+$ and $I_2$ 622$^-$. More specifically, the current generator 602 generates a DC current 624a that adds to the current $I_1$ 622$^+$. Likewise, the current generator 604 generates a DC current 624b that adds to the current $I_1$ 622$^-$. The currents 624a and 624b do not flow through the mixing FETs 608-612, and therefore are not involved in the mixing process performed by the FETs 608-612. As a result, the currents 622$^+$ and 622$^-$ are increased without increasing the amplitude requirements on the LO drive 333, and without increasing the size requirements of the FET devices 608-612. The DC current sources 602 and 604 are set to provide predetermined portions of the total current 622$^+$ and 622$^-$, respectively, and can be adjusted as desired. In other words, the DC current sources 602 and 604 can be adjusted to minimize the flicker noise of the FETs 608-614, as desired.

The DC currents 624a and 624b can be referred to as "bleeder currents", because they bleed-off some of the current requirements that flow through the mixing FETs 608-612.

FIG. 7 further illustrates the mixer 334. In FIG. 7, the variable DC current source 602 is implemented as cascode-connected FETs 704 and 706 to generate the bleeder current 624a. The FETs 704, 706, 708, and 710 are biased at their respective gates to provide the desired bleeder currents 624a and 624b to reduce flicker noise. The variable DC current source is implemented as cascode-connected FETs 708 and 710 to generate the bleeder current 624b. Bias for the variable DC current sources 602 and 604 are connected to the nodes 714 and 716, which provides the proper gate voltages to produce the desired bleeder currents 624a and 624b. Furthermore, FIG. 7 further illustrates the mixer 334 having capacitors 702, 703, 711, 712 that provide some lowpass filtering for the output signal 335. The devices 718 and 720 are spare or dummy devices.

Tuneable Baseband Filters

As stated above, the tuneable baseband filters 344a,b lowpass-filter the I and Q baseband signals 343a,b to remove unwanted frequencies, so to produce baseband signals 345a, b. FIG. 8 further illustrates the tunable baseband filter 344a or 334b according to embodiments of the present invention. Referring to FIG. 8, the tunable baseband filter 344 includes a group of integrators 804a-e that are series connected with a group of corresponding summers 802a-e. As illustrated, the output of the nth integrator 804 is fed back to the (n−1)$^{th}$ associated summer 802. For example, the output of the integrator 804b is fed back to the input of the summer 802a, and the output of the integrator 804c is fed back to input of the summer 802b.

The tuneable lowpass filter 344 simulates the operation of a conventional Butterworth lowpass filter 900 that is shown in FIG. 9. The integrators 804 simulate the corresponding elements of the lowpass filter Butterworth filter 900, where the Butterworth elements are indicated over the integrator 804 in FIG. 8. For example, the integrator 804a simulates the electrical response of the 1/RC$_1$ in the Butterworth filter 900, and the integrator 804b simulates the electrical response of the R/L$_2$ in the Butterworth filter 900.

The Butterworth filter 900, and all Butterworth filters, have a known frequency response and cutoff frequency, which can be used as a design methodology for the lowpass filter 800. For a given filter specification (e.g. cutoff frequency, in-band ripple, etc.), the circuit elements (i.e. R, L, C values) of the Butterworth filter 900 can be calculated using known techniques. Afterwhich, the active integrators 804 are configured to simulate the circuit elements in the Butterworth filter 900. The specific configuration of the integrators 804 in FIG. 8 is often referred to as a "Leapfrog" synthesis or configuration. Other configurations could be used to simulate a passive Butterworth with active filter elements, and are known to those skilled in the arts. However, it has been found that the leapfrog configuration provides the lowest sensitivity to circuit component variation, and provides good noise performance. Furthermore, other types of filters, other than a Butterworth, could be used depending on the application.

An exemplary stage 806 of the filter 344 includes the summer 802c and the integrator 804c. FIG. 10 further describes the exemplary stage 806 as an active op amp RC filter having resistors 1002a-d, capacitors 1004a,b, and an operational amplifier 1006, all of which are configured to be differential. The operational amplifier 1006 provides the integration function for the integrator 804 over the filter response that is determined by the capacitors 1004 and the resistor 1002a-d. For example, the resistors 1002 provide the resistance associated with resistor 1/RC$_3$ in the integrator 804c, and the capacitors 1004a,b provide the capacitance associated with the integrator 804c. The differential voltages V$_2$ (output of integrator 804b) and V$_4$ (output of integrator 804d) are wire-ored together at the input of the operational amplifier 1006 to construct the summer 802c.

In one embodiment of the invention, the capacitors 1004 are realized using metal-oxide semiconductor (MOS) devices that are configured as capacitors (MOSCAPs). Alternatively, the capacitors 1004 are metal-metal capacitors. MOSCAPs produce a variable capacitance depending on the voltage that is placed across the MOSCAP. For example, FIG. 11 illustrates stages 806 and 808 having MOSCAPs 1104 to implement the capacitors 1004. The capacitance provide by each MOSCAP 1104 is determined by the bias voltages V$_{B1}$ and V$_{B2}$ that are placed across the MOSCAP, where V$_{B2}$ is generally greater than V$_{B1}$. For example, V$_{B2}$ may be 2.3V and V$_{B1}$ may be 1.3V, to produce a desired capacitance. Since the filter stages 806 and 808 are connected in-series, the level shifters 1106a,b are inserted between the stages 806 and 808 to level shift bias voltage V$_{B2}$ from stage 806 to V$_{B1}$ for the stage 808. Without the level shifters 1106, then V$_{B2}$ from the gate of MOSCAP 1104 (stage 806) would bleed over to the source of the MOSCAP 1104c, eliminating the voltage bias across MOSCAP 1104c. The level shifters 1106 create a DC offset (from V$_{B2}$ to V$_{B1}$) between the stages 806 and 808, permitting the use of the MOSCAPs 1104 for the capacitors 1004. As will be apparent to those skilled in arts, the level shifters 1104 can be inserted between all the stages of the filter 344, to permit the MOSCAPs 1104 to be used in all the stages of the filter 344.

FIG. 12 illustrates one embodiment of the level shifter 1106 that is known as a source follower circuit that drops the voltage from $V_{B2}$ to $V_{B1}$ based the voltage drop through the resistor 1204. Preferably, the $g_m$ of the FETs 1202, 1206 is sufficiently large to minimize signal non-linearity and to drive a low resistor 1204. An advantage of the level shifter in FIG. 12 is that the op amp 1006 only needs to drive a capacitance load, which relaxes the design requirement on the op amp 1006. Furthermore, there is no headroom issue with the level shifter 1106, so the size of the current source 1206 can be made small resulting in a small parasitic capacitance, and therefore good overall bandwidth.

As discussed herein, it is desirable to tune the cutoff frequency of the baseband filter 344 to accommodate changing baseband bandwidth requirements for various service providers. For example, in embodiments of the invention, it is desirable to tune the lowpass cutoff frequency from 2 MHz to 36 MHz to provide for varying satellite service provider requirements. Referring to FIG. 10, this can be accomplished by tuning either the resistors 1002 or the capacitors 1004. Capacitor tuning is typically performed with a bank of parallel capacitors that are incrementally switched-in or out by operating corresponding switches that are in series with the capacitors. However, when the preferred MOSCAP are utilized, tuning capacitance is not desirable because a big MOS switch is needed to minimize the resistance, resulting in a large parasitic capacitance that reduces bandwidth and provides poor tuning accuracy. As a result, it is preferable to tune the resistors 1002 to accomplish tuning of the lowpass cutoff frequency.

FIG. 13 further illustrates an example tunable resistor 1002 for the purpose of tuning the cutoff frequency of the lowpass filter 344. Referring to FIG. 13, the tunable resistor 1002 includes a plurality of resistors 1302 that are connected in parallel, where each resistor 1302 includes a series-connected switch that can be a MOSFET switch. The cutoff frequency of the lowpass filter 344 is dependent on 1/RC. Therefore, the cutoff frequency can be adjusted by incrementally adding or moving the resistors 1302 to or from the resistor 1002. In embodiments of the invention, the resistors 1302 are binary weighted. In other words, the value of the resistors 1302 have a binary relationship as illustrated in FIG. 13. For example, the resistor 1302a can have a value of R, and the resistors 1302b-1302f can have the values R/2, R/4, R/8, R/16, and R/32, respectively. The binary relationship can produce frequency tuning in pre-defined frequency steps. For example, the cutoff frequency can be tuned in 1 MHz frequency steps using a 6-bit binary weighted resistors 1302, for a 5th order Butterworth having capacitive elements C1=3.93pF, C2=10.85 pF, C3=12.73 pF. The cutoff frequency can be tuned in 1 MHz steps, where R is determined according to the following equation:

$$R = (25 \text{ Kohm})/(1 \text{ MHz} * f_C) \quad (1)$$

The ability to tune the cutoff frequency of the lowpass filter 344 in predefined frequency steps allows the same tuner 306 to be used by multiple service providers that may have different baseband bandwidth requirements. The tuner 306 can be mass produced without regard for the baseband bandwidth requirement of the ultimate service provider. Once a service provider is identified, the cutoff frequency of the lowpass filter 344 can be adjusted in predefined frequency steps by incrementally adding or subtracting the resistors 1304 by closing the appropriate switches.

Furthermore, the decision to tune the cutoff frequency by adjusting the resistors in the lowpass filter 334, means that the capacitors 1004 can be fixed. This is advantageous because tuning capacitors in a MOSFET device requires significantly larger substrate area than tuning resistors. In other words, adjusting the resistors 1002, instead of the capacitors 1004, allows the tunable lowpass filter 344 to be integrated on the same substrate with the rest of the components of the tuner 306, instead of being placed off-chip.

In alternative embodiments of the invention, the tunable resistors 1002 are variable "analog" resistors that are continuously variable.

DC Offset Compensation

As discussed herein, the tuner 306 is preferably configured to be differential to optimize noise performance. Differential signals have a positive signal component and a negative signal component. Component mismatches can produce a DC voltage offset to develop between the positive signal component and the negative signal component. DC offset voltages are undesirable because they can easily saturate a differential amplifier and other components in a differential system.

AC coupling is one known technique for addressing DC offset. AC coupling uses series capacitors to block any DC voltage buildup, thereby removing any DC offset. However, since the capacitors are series coupled, they must be sufficiently large to pass the desired AC signal. At baseband frequencies, the capacitors would be extremely large, preventing the integration of these capacitors on-chip. Therefore, the present invention utilizes a DC compensation circuits 348 to sense the DC offset voltage at the tuner output 114. The DC compensation circuits 348 remove the DC offsets from the respective I and Q baseband signals 114a and 114b using a subtractive feedback technique, without the need for series capacitors.

FIG. 14 further illustrates the DC compensation circuit 348 for either the I channel or the Q channel, without regard for the in-phase or quadrature signal status. The DC compensation circuit includes the VGA 338, the baseband filter 344, the amplifier 346, and the DC servo 342. The DC Servo 342 provides negative fed back path for the DC offset and cancels the DC offset at the output of the VGA 338.

The DC servo 342 includes two transconductance amplifiers 1406,1410, and a lowpass filter 1408. The amplifier 1410 senses the positive component 114$^+$ and the negative component 114$^-$ of the output signal 114, and amplifies any voltage difference between the positive component 114$^+$ and the negative component 114$^-$. The amplifier 1408 is a differential transconductance amplifier that converts any voltage difference to a differential current 1409. In other words, the greater the voltage difference, the larger the differential current output 1409 of the amplifier 1408. The lowpass filter 1408 removes all the high frequency content from the differential current 1409 and passes only the low frequency content, which contains the DC offset voltage 1407. In embodiments of the invention, the cutoff frequency of the lowpass filter 1408 is set to 100 Hz (or below), so that only the DC offset voltage 1407 is passed to the amplifier 1406. The amplifier 1406 is a transconductance amplifier that converts the DC offset voltage 1407 to a corresponding differential DC offset current 1405 that is sent to the VGA 338.

The VGA 338 is two stage amplifier having a first amplifier 1402 and a second amplifier 1404. The first amplifier 1402 is a transconductance amplifier that converts the differential baseband signal 337 from a differential voltage to a differential current 1403. The output of the amplifier 1406 in the DC servo 342 is combined with the output of the amplifier 1402 at the nodes 1412 and 1414. More specifically, the positive output of the DC servo amplifier 1406 is connected to the negative output of the amplifier 1402 at the node 1414. Likewise, the negative output of the DC servo amplifier 1406 is connected to the positive output of the amplifier 1402. Therefore, the DC offset current 1405 is combined 180 degrees out-of-phase with the differential baseband current 1402 at the nodes 1412 and 1414, canceling any DC offset in the baseband current 1402. The resistors 1416 and 1418 convert the differential current at the nodes 1412 and 1414 to a differential voltage 1420. The differential 1420 corrects any DC offset introduced by amplifier 1402 and all subsequent stages 1404, 344, and 346, to minimize or eliminate the offset at the outputs 114+ and 114−. The differential voltage 1420 is received at the variable amplifier 1404 that is controlled by the AGC signal 350. The variable amplifier 1404 variably amplifies the differential voltage 1420 according to the AGC signal 350, to generate the VGA output signal 343 that is free of DC voltage offset.

An advantage of the DC compensation circuit 348 is that the DC offset signal 1405 is fed back to the input of the amplifier 1404 of the VGA 338, instead of to the output of the amplifier 1404 in the VGA 338. This configuration has a better noise performance than the combining the DC offset signal 1405 at the output of the VGA 338.

As stated above, the lowpass filter removes all the higher frequency content from the differential current 1409 and passes only the DC offset voltage 1407. It is important reject the higher frequency content in the differential current 1409 so that it does not cancel the intended baseband information in the baseband signal 1403. In other words, it is important that only the DC offset gets canceled when combining signals 1403 and 1405. In embodiments of the invention, the lowpass filter 1408 is capacitor 1502 that is shown in FIG. 15. The capacitor 1502 is connected across the differential output of the DC servo amplifier 1410 and is large enough to short out the higher frequency content in the differential current 1409, with the exception of DC offset voltage. In embodiments of the invention, the capacitor sufficiently large to short out all signals above 100 Hz, and thereby substantially passes only the DC offset voltage to the amplifier 1406. Furthermore, in embodiments of the invention, the capacitor 1502 is located off-chip, due to its size. Alternatively, if a smaller capacitor can be used, the capacitor 1502 can be located on-chip.

The flowchart 1600 summarizes the operation of the DC compensation circuit 338 in removing DC offset from an input differential baseband signal, according to embodiments of the present invention.

In step 1602, the input differential baseband signal is received by the DC compensation circuit and converted to an input differential baseband current. For example, the transconductance amplifier 1402 receives the differential baseband signal 337 and converts it to a differential baseband current 1403. At this point, any DC offset that is present is still in the differential baseband current 1403.

In step 1604, the differential output voltage of the DC compensation circuit is sensed and converted to a differential current. For example, the transconductance amplifier 1410 converts the differential output voltage 114 to a differential current 1409.

In step 1606, the differential output current is lowpass filtered to substantially pass only the DC offset information and to reject the baseband signal information, producing a differential signal representative of the DC offset. For example, the lowpass filter 1408 filters the differential output current 1409 to produce a differential voltage 1407 that substantially contains only the DC offset voltage.

In step 1608, the DC offset voltage from the lowpass filter is amplified and converted to a differential DC offset current that represents the DC offset voltage. For example, the transconductance amplifier 1406 converts the DC offset voltage 1407 to a differential current 1405.

In step 1610, the differential DC offset current is inverted so that it is 180 degrees out-of-phase with the differential input baseband current. For example, the output of the transconductance amplifier 1406 is connected to the output of the transconductance amplifier 1402 so that the positive and negative terminals are reversed at the nodes 1412 and 1414.

In step 1612, the inverted DC offset current is combined with the input baseband current so that the DC offset at the output is canceled. For example, the DC offset current 1405 is combined with the input baseband current 1403 at the nodes 1412 and 1414, canceling any DC offset going into the output amplifier 1404 of the VGA 338, and canceling any DC offset at the output of the VGA 338.

Baseband Filter Tuning

As stated above, the baseband filters 344 are tunable to accommodate the varying bandwidth requirements of different service providers. For example, in embodiments of the invention, it is desirable to tune the cutoff frequency of the baseband filters from 2-36 MHz using the I²C control 354. In embodiments, it is desirable to tune the cutoff frequency in 1 MHz increments. As described herein, and referring to FIG. 10, the filter tuning is performed by varying the resistor values 1002 in exemplary filter stage 806 to adjust the cutoff frequency of the tuner 306. FIG. 17 and the discussion that follows further describes tuning the cutoff frequency of the baseband filter 344 by tuning the variable resistors 1002. FIG. 17 is depicted as single-ended instead of differential for ease of illustration, but the tuning procedure described in relation to FIG. 17 applies equally well to differential configurations as will be understood by those skilled in the relevant arts.

FIG. 17 illustrates an active low-pass filter and compensation circuit for achieving accurate filtering on an integrated circuit. In order to overcome manufacturing process variations and errors introduced by temperature variations, an active low-pass filter 1702 has been combined with a compensation circuit 1704 in order to accurately adjust the corner frequency of the low-pass filter 1702. (Low pass filter 1702 is a single ended version of baseband filter stage 806 in FIG. 10). In general, the compensation circuit 1704 generates a control signal 1706 to adjust two variable resistors (1716 and 1720). Variable resistor 1716 in the compensation circuit 1704 and variable resistor 1720 in the active low-pass filter 1702 are substantially identical and are adjusted by control signal 1706 as a function of the equivalent resistance of a switched-capacitor 1708, and the $V_{adj}/V_{ref}$ ratio that determines the corner frequency of the lowpass filter.

Specifically, compensation circuit 1704 comprises switched capacitor 1708, an amplifier 1710, a comparator 1712, a successive approximation register (SAR) 1714 and a variable resistor 1716. An adjustable voltage ($V_{ADJ}$) is applied to an input of the switched-capacitor 1708. An output of switched-capacitor 1708 is coupled to an inverting input of amplifier 1710. A non-inverting input of amplifier 1710 is coupled to ground. An output of amplifier 1710 is coupled to an inverting input of a comparator 1712.

A reference voltage ($V_{REF}$) is coupled to a non-inverting input of comparator 1712. An output of comparator 1712 is coupled to an input of A/D converter 1714. The A/D converter 1714 produces the control signal 1706, which is described in further detail below. The variable, or otherwise adjustable resistor ($R_{ADJ}$) 1716 is coupled between the inverting input of amplifier 1710 and its output (which is also the inverting input of comparator 1712). Control signal 1706 is also coupled to $R_{ADJ}$ 1716 to change its resistance value.

The active low-pass filter (LPF) 1702 comprises a variable resistor 1720, a capacitor 1722 and an amplifier 1724. A signal to be filtered is applied to a first node label $V_{IN}$, which is coupled to resistor 1720. Resistor 1720 also coupled to the inverting input of amplifier 1724. A non-inverting input of amplifier 1724 is coupled to ground. Capacitor 1722 is coupled across the inverting input of amplifier 1724 and its output node, which is labeled as $V_{OUT}$. Variable resistor 1720 also receives control signal 1706 to change its resistance value.

Operation of the compensation circuit 1704 in FIG. 17 will be described next. To illustrate the operation of compensation circuit 1704, consider a case in which voltages $V_{ADJ}$ and $V_{REF}$ are kept constant. Also, for this explanation, assume comparator 1712 and SAR 1714 simply comprise a amplifier 1730 that produces the control signal 1706 to adjust resistor 1716. In the simple case, the amplifier 1730 will produce a control signal 1706 to adjust resistor 1716 to match the value of resistor 1708 until the output voltage of amplifier 1710 is equal to $V_{REF}$. Thus, once the voltage levels at the input of amplifier 1730 are the same, control signal 1706 will no longer change the resistance of resistor 1716.

In order to establish an accurate corner frequency for the active low-pass filter 1702, the product of the resistance value for resistor 1720 and the capacitance value for capacitor 1722 must be accurate. Since a stable capacitance value can be achieved using existing semiconductor manufacturing techniques, an initial capacitance value for capacitor 1722 can be determined. However, because of processing variations and temperature variations, the exact capacitance of the capacitor can vary from chip-to-chip. Because the capacitance would vary from chip-to-chip the corner frequency will also vary even though an accurate fixed resistance value for th resistor 1720 is provided, as described above.

The exact corner frequency, however, can be achieved by varying the resistance of resistor 1720 to an exact resistance value equal to $1/[2\pi f_C C]$, where $f_C$ is the corner frequency of th low-pass filter. This can be achieved using a switch-capacitor circuit for $R_{SC}$ 1708.

In embodiments, a capacitance value and switching frequency value are selected for switching-capacitor 1708 in order to achieve the exact desired resistance for the active low-pass filter 1702. In operation, since the ideal amplifier 1730 produces control signal 1706 so as to cause the resistance of variable resistor 1716 to match the resistance of switch capacitor 1708, control signal 1706 is also supplied to variable resistor 1720. Thus, by achieving a desired equivalent resistance at switched capacitor 1708, the compensation circuit 1704, via amplifier 1730, will produce a control signal 1706 so as to cause resistor 1720 of the active low pass filter 1702 to produce a resistance value for resistor 1720 equal to the affective resistance of switch-capacitor 1708 equal to $1/[f_{CLK}*C_{SC}]$, where $F_{CLK}$ is the switching frequency and $C_{CS}$ is the capacitance value of $C_S$ in the FIG. 18. Equating this resistance value to $1/[2\pi f_C C]$ in order to get the desired accurate corner frequency of the low pass filter will be described below. In summary, the resistance of variable resistors 1716 and 1720 is adjusted via the control signal 1706 until the desired value for the LPF corner frequency is achieved.

According to one embodiment of the present invention, adjusting $f_{CLK}$ of the switched capacitor 1708 will change its resistance. To compensate, amplifier 1730 adjusts control signal 1706 to change the value of resistor 1720, thereby changing the LPF corner frequency of the active low-pass filter 1702.

According to another embodiment of the present invention, control signal 1706 is changed by adjusting a ratio "K" of voltages $V_{ADJ}$ and $V_{REF}$ (i.e., $K=V_{ADJ}/V_{REF}$), while $F_{CLK}$ remains constant:

$$R = \frac{1}{C_{SC} \cdot f_{CLK} \cdot K} \quad (2)$$

Changing the ratio "K" causes the differential voltage at the input of amplifier 1730 to change. To compensate, the amplifier 1730 changes control signal 1706 so as to vary the resistance of adjustable resistor $R_{ADJ}$ 1716, thereby causing the voltage at its inverting input to again match the voltage at its non-inverting input. At the same time control signal 1706 adjusts the resistance of resistor 1716 to compensate for the changed voltage ratio, control signal 1706 also changes the resistance of resistor 1720 thereby changing the corner frequency of the active low-pass filter 1702. In order to tune the corner frequency of the low-pass filter from 2 MHz to 36 MHz, K is varied from 1 to 18 respectively in this design. However, in order to make the design insensitive to errors produced by the non-idealities of the switch capacitor circuit 1708 and the operational amplifier 1710, high values of K are desired. By dividing $f_{CLK}$ for lower-half corner frequencies, K is circulated from 8 to 18 instead of changing from 1 to 18. This technique improves the circuit sensitivity for corner frequencies from 2 MHz to 15 MHz. The sensitivity is further improved by reducing the offset voltage of the operational amplifier 1710 and the comparator 1712 by employing an offset-cancellation scheme in the comparator 1712.

Also, according to this latter embodiment of the present invention, the ratio of voltages $V_{ADJ}$ and $V_{REF}$ can be changed by changing either $V_{ADJ}$ or $V_{REF}$, or both $V_{ADJ}$ and $V_{REF}$. Preferably, $V_{REF}$ can be set to a constant reference voltage, while voltage $V_{ADJ}$ is adjusted so as to change the corner frequency of the active low-pass filter 1702. The voltages $V_{ADJ}$ and $V_{REF}$ can be implemented using a resistor ladder with variable tap points. Other voltage sources can be used to provide $V_{ADJ}$ and $V_{REF}$, as would become apparent to a person skilled in the relevant art.

The switch capacitor $C_{SC}$ in FIG. 18 is implemented as a NMOS in NWELL capacitor, the same way for the C 1722 in the low-pass filter. In one embodiment, $F_{CLK}$ is equal to 16 MHz, and the value of Csc is scaled to be $\pi*C/4$ in order for R in Equation 2 above to be equal to $1/(2\pi f_C C)$. As a result, the desired accurate corner frequency of the low-pass filter will be established.

Variable resistors 1716 and 1720 can be implemented in a variety of ways. Each can comprise a bank of selectable resistors, for example. Other equivalent resistor networks will become apparent to a person skilled in the relevant art.

Control signal 1706 can be a digital signal so as to select one or more of the individual resistors in each respective resistor bank. In order to produce a digital control signal 1706, the analog-to-digital converter 1730 can comprise a comparator 1712 coupled to a SAR 1714. Other equivalent circuit to implement the functionality of amplifier 1730 for generating control signal 1706 will become apparent to a person skilled in the relevant art.

The switched capacitor 1708 is further illustrated in FIG. 18. A switched capacitor is based on the realization that a capacitor switched between two circuit nodes at a sufficiently high rate is equivalent to a resistor connecting these two nodes. Specifically, the two switches $S_1$ and $S_2$ of FIG. 18 are driven by a non-overlapping, two-phase clock, $F_{CLK}$. During clock phase $\phi_1$ capacitor $C_S$ charges up to a voltage at node 1802 by closing $S_1$. Then, during a second clock phase $\phi_2$, capacitor $C_S$ is connected to the output node 1804 by closing $S_2$, and the capacitor $C_S$ is forced to discharge, transferring its previous charge to the output node 1804. Thus, if $f_{CLK}$ is much higher than the frequency of the voltage wave forms of $V_{IN}$, then the switching process can be taken to be essentially continuous, and a switched-capacitor can then be modeled as an equivalent resistance as shown in the equation below:

$$R_{eq} = \frac{1}{C \cdot f_{CLK}} \quad (3)$$

For illustration purposes, FIG. 18 includes an inverter 1806 that inverts $f_{CLK}$ to generate the opposite phase clock $\phi_2$. Any person skilled in the relevant art will recognize that the non-overlapping clocks $\phi_1$ and $\phi_2$ can be produced in many ways. Moreover, switches $S_1$ and $S_2$ can be implemented with transistors (for example, metal oxide semiconductor field affect transistors (MOSFETs), or the like). Additionally, various means are commercially available for generating the clock frequency.

The tuning of the low pass filter 344 is further described in co-pending patent application, entitled, "Low Pass Filter Corner Frequency Tuning Circuit and Method", Ser. No. 09/995,795, filed herewith, and which is incorporated by reference herein in its entirety.

Low Noise Amplifier

As discussed herein, the LNA 304 receives the differential RF signal 303 from the off-chip balun 302. The LNA 304 variably amplifies the differential RF signal 303 according to an RF AGC control 352, to produce a differential RF signal 305. The differential RF signal 305 is forwarded to the RF input of the IQ mixers 334 for down-conversion.

FIG. 19 further illustrates the LNA 304 according to embodiments of the invention. The LNA 304 includes a combination attenuator and matching circuit 1902 (herein called attenuator 1902 for convenience), a control circuit 1930, a gain block 1916, and an output matching circuit 1928. The gain block 1916 includes a high gain amplifier 1918 and a low gain amplifier 1922. The differential RF signal 303 is coupled directly to the high gain amplifier 1918. The attenuator 1902 also receives the differential RF signal 303 and generates an attenuated differential RF signal 1921 that is coupled to the low gain amplifier 1922. The high gain amplifier 1918 variably amplifies the differential RF signal 303, and the low gain amplifier 1922 variably amplifies the attenuated differential RF signal 1921. The outputs of the high gain amplifier 1918 and the low gain amplifier 1922 are combined in a summer 1920 to produce an amplified output 1927. The output matching circuit 1928 provides an impedance match for the output signal 1927 to the IQ mixers 334, to produce the LNA output signal 305 that is sent to the IQ mixers 334.

The high gain amplifier 1918 and the low gain amplifier 1922 include a plurality of amplifiers that are configured in-parallel and are controlled in groups by AGC control signals 1924 from the control circuit 1930. The AGC controls signals 1924 are generated by DC amplifiers 1923 based on the master AGC control signal RF AGC 352 (FIG. 3). The control circuit 1930 also generates bias currents 1926 for the amplifiers in the high and low gain amplifiers 1918 and 1922, based on the master AGC control signal RF AGC 352. The structure and operation of the components of the LNA 304 are described further below.

The attenuator 1902 includes resistors 1906a and 1906b, resistors 1910a and 1910b, and tapped inductors 1908a and 1908b. The attenuated differential RF signal 1921 is tapped-off the center of the tapped inductors 1908a and 1908b. The tap point on the inductors 1908 is chosen to provide a desired attenuation for the attenuated signal 1921. In embodiments of the invention, the inductors 1908 are tapped so as to provide 12 dB of attenuation. The amplifiers 1918 and 1922 are implemented using MOSFETs that have a capacitive input. The tapped inductors 1908 help match the input impedance looking in to the attenuator 1902 to a real impedance over the frequency band of interest. The remaining component values of the attenuator 1902 are determined to provide the desired attenuation and to provide a good impedance match to the amplifiers 1918 and 1922 over the frequency band-of-interest, (950 MHz to 2150 MHz). More specifically, the resistors 1906 and 1910 contribute to a flat amplified match over the desired frequency band. Therefore, the combination of the tapped inductors 1908 and the resistors 1910 and 1906 provide a flat and smooth impedance match over frequency, and well as providing the desired signal attenuation. In embodiments of the invention, the resistors 1906a,b are chosen to be 23.1 ohms and resistor 1910a,b are chosen to be 8.7 ohms. By adding some minimal off-chip matching elements, this provides 75 ohm input impedance over the desired frequency band of 950-2150 MHz at the output of the balun 302.

The attenuator 1902 also includes a node 1911 between resistors 1910a and 1910b. This node 1911 can be grounded through a capacitor 1905 to a center tap 1904 of the attenuator 1902. Alternatively, the center tap 1904 can be left ungrounded and used for a single-ended input.

The tapped inductors 1908a,b provide a DC path to the FETs in the high gain amplifier 1918 and the low gain amplifier 1922. Therefore, a bias voltage can be placed at the node 1914, to bias the FETs in the high gain amplifier 1918 and the low gain amplifier 1922. The capacitor 1905 DC blocks the bias voltage at the node 1914 from the ground at the center tap 1904. Furthermore, the inputs 303 are also DC blocked. Since a FET gate draws practically zero current, there is no voltage drop across the resistors 1912, 1910, or 1906. Furthermore, the resistor 1912 is large (greater than 10K ohms) so as not to load AC signal.

FIG. 20 further illustrates the gain block 1916 and the configuration of the high gain amplifier 1918, the low gain amplifier 1922, and the summer 1920. The high-gain amplifier 1918 includes a set of 3 binary weighted gain stages identified as ½ gain stage, ¼ gain stage, ⅛ gain stage_a, which amplify the unattenuated differential RF signal 303. The low gain amplifier 1922 includes another set of 3 binary weighted gain stage identified as ⅛ gain stage_b, 1/16 gain stage, and 1/32 gain stage, which amplify the attenuated differential RF signal 1921. Each gain stage contains one or more identical parallel-connected unit gain amplifiers 2002 having outputs that are wire-ored together, thus forming the summer 1920. In other words, all the outputs of the high gain stage 1918 are wired-ored with all the outputs of the low gain stage 1922. The number of unit amplifiers in each gain stage varies depending on the relative gain assigned to each stage. For example, the ½ gain stage include 16 out of 35 total amplifiers 2002 that are shown in FIG. 19. The ¼ gain stage includes 8 out of 35 total amplifiers 2002, and so on. Since the outputs of the binary weighted stages are summed, the ½ gain stage provides approximately ½ of the gain of the LNA 304, the ¼ gain stage provides approximately ¼ of the gain, and so on. As will be apparent, the invention is not limited to the number and grouping of amplifiers 2002 that are shown in FIG. 19. Other configurations and amplifier quantities could be utilized as will be understood by those skilled in the arts. These other configurations are within the scope and spirit of the present invention.

The AGC signals 1924 are differential and adjust the gain of the corresponding binary weighted gain stage by adjusting the gain of the unit gain amplifiers 2002. For example, the AGC 1924_½ controls the unit gain amplifiers 2002-1 to 2002-16, the AGC 1924_¼ controls the unit gain amplifiers 2002-17 to 2002-24, and so on. Likewise, the bias control signals 1926 supply and adjust the current bias for the unit gain amplifiers 2002 in the corresponding binary gain stages. For example, the bias control signal 1926_½ controls the unit gain amplifiers 2002-1 to 2002-16 in the ½ gain stage. Likewise, the bias control signal 1926_¼ controls the unit gain amplifiers 2002-17 to 2002-24 in the ¼ gain stage, and so on.

FIG. 21 further illustrates an example unit gain amplifier 2002. Referring to FIG. 21, the unit gain amplifier 2002 includes a variable current source 2122, a differential pair 2116 having FETs 2118 and 2120, an output steering circuit 2102 having FETs 2104-2110, and bleeder resistors 2112 and 2114. The differential pair 2116 receives the RF differential signal 303 or 1921 depending on whether the unit gain amplifier 2002 is in the high gain amplifier 1918 or the low gain amplifier 1922. The differential pair 2116 amplifies the RF differential signal 303 (1921) to produce a differential output current 2117. The output steering circuit 2102 receives the differential output current 2117 and steers the current 2117 to the amplifier output nodes 2101 or to the analog power supply $av_{dd}$, wherein the current steering is controlled by the corresponding agc signal 1924. More specifically, the agc signal 1924 controls the gates of the FETs 2104-2110 so as to steer the differential output current 2117 to either the output 2101 or to the output $av_{dd}$. The bleeder resistors 2112 and 2114 bleed-off some of the current from the differential pair 2116 to improve overall circuit headroom.

During operation, the differential agc signal 1924 is increased when more gain is required, so that more of the differential output current 2117 is steered to the output 2101 instead of the analog power supply $av_{dd}$. Likewise, the agc signal 1924 is reduced when less gain is required, so that more of the differential output current 2117 is steered to the analog power supply $av_{dd}$, instead of to the output nodes 2101. At some point during gain reduction (called the 0-gain threshold), substantially all of the current 2117 is steered to the power supply $av_{dd}$. When this occurs, the unit gain amplifier 2002 is no longer providing any gain to the LNA 304.

As indicated in FIG. 20, all the unit gain amplifiers 2002 in a binary weighted gain stage are controlled by the same AGC signal 1924. For example, the unit gain amplifiers 2002-1 to 2002-16 in the ½ gain stage are all controlled by the same AGC signal 1924_½. Likewise, the unit gain amplifiers 2002-17 to 2002-24 in the ¼ gain stage are all controlled by the same AGC signal 1924_¼, and so on. Therefore, at the 0-gain threshold, all of the amplifiers 2002 in a binary weighted gain stage stop contributing to the gain of the LNA 304, almost simultaneously.

The variable current source 2122 provides current bias for the differential pair 2116. The variable current source 2122 is controlled by the bias control signal 1926 from the control block 1930 (FIG. 3). In one embodiment of the invention, the variable current source 2122 is shut-off when the 0-gain threshold is reached, and all the differential pair output current 2117 has been steered to the analog power supply $av_{dd}$. This reduces overall signal distortion in the output signal 305 because non-linear feedthrough is removed from the signal path. Preferably this is done only in the binary weighted amplifiers of the high gain amplifier 1918, but could also be done it the low gain amplifier 1922, if so desired.

Referring back to FIG. 19, the overall AGC control for the LNA 304 is now discussed. When the input differential RF signal 303 has a relatively large amplitude, the master AGC control signal 352 reduces the gain of the LNA 304. More specifically, the DC amplifiers 1923 receive the AGC control signal 352 and generate individual AGC control signals 1924 to reduce the gain of the binary weighted gain stages in the high gain and low gain amplifiers 1918 and 1920. The gain of the high gain amplifier gain stages are reduced first and then the gain of the low gain amplifier gain stages are reduced. More specifically, the ½ gain stage is reduced first until it reaches the 0-gain threshold, and then the ¼ gain stage is reduced, and so on. Eventually, all the binary weighed gain stages in the high gain amplifier 1918 stop contributing gain to the LNA 304. If further gain reduction is required, then the binary weighted gain stages are reduced in the low gain amplifier 1922. The practice of fading the gain on the high gain amplifier 1918, and then fading the gain of the low gain amplifier 1922, produces less than 1 dB of noise figure reduction for each 1 dB of attenuation as the gain is reduced. The 12 dB attenuation value for the attenuator 1902 is determined to provide a good comprise between noise figure and distortion. In embodiments of the invention, the gain ranges of the high gain amplifier 1918 and the low gain amplifier 1922 overlap. In other words, the gain of the low gain amplifier 1922 drops before all the gain is gone in the high gain amplifier 1918.

In one embodiment, the control block 1930 also powers down the amplifiers 2002 in the high gain amplifier 1918 using the bias control signals 1926 when all of the binary weighed gain stages in the high gain amplifier 1918 are providing 0 gain. (i.e. all the output current 2117 is being steered to $av_{dd}$ in each of the ½ gain stage, ¼ gain stage, and ⅛ gain stage) It has been found that this improves signal distortion in the LNA output signal 305 because it removes non-linear signal feedthrough parasitic components associated with a powered-up unit gain amplifier 2002. Preferably, the high gain amplifier 1918 is powered down only when all the binary weighed stages in the amplifier 1918 are at the 0 gain threshold. Alternatively, the binary weighed stages in the high gain amplifier 1918 could be turned-off one at a time, as they reach the 0-gain threshold. For example, the ½ gain stage could be powered down when it reaches the 0-gain threshold, without waiting for the ¼ gain stage to reach the 0-gain threshold. Preferably, the binary weighted gain stages in the low gain amplifier 1922 remain powered-up, even after they have reached the 0-gain threshold. This can be done because the low gain amplifier 1922 produces little signal distortion. (i.e. the non-linear parasitics are relative small because of the smaller gain) However, these binary weighted gain stages in the low gain amplifier 1922 could also be powered-down at 0-gain, if so desired.

FIG. 22 further illustrates the output matching network 1928 that matches the output of the LNA 304 to the input of the differential mixers 334. The output matching network 1928 includes series inductors 2202a and 2202b, inductors 2204a and 2204b, resistors 2208a and 2208b, capacitors 2206a and 2206b, feedforward capacitors 2210a and 2210b, and feedforward resistors 2212a and 2212b. In embodiments, the inductors 2202 are 8.8 nH inductors, the inductors 2204 are 6.5 nH inductors, the capacitors 2206 are 4.55 pF "finger" capacitors, the resistors 2208 are 44.4 ohm resistors to $av_{dd}$, the feedforward capacitors 2210a are 0.1 pF and the feedforward resistors 2212 are 1.5 Kohms. These component values provide a good impedance match over the frequency band of interest (950-2150 MHz).

The DC amplifiers 1923 that generate the AGC control signals 1924 are preferably DC differential amplifiers. These differential amplifiers can have a resistor across their inputs to reduce (or degenerate) the signal gain. Furthermore, a DC amplifier 1929 generates the bias control signals 1926 that power-up and power-down the binary weighed gain stages in the high gain amplifier 1918 and the low gain amplifier 1922. The DC amplifier 1929 preferably does not have the degeneration resistor across its inputs. Therefore, the high amplifier is quickly powered-down when the 0 gain condition is met for all the gain stages in the high amplifier 1918.

In embodiments, the DC amplifier 1923 that controls the unit gain amplifier 2002-35 in the ⅟32 gain stage amplifier can be configured for either variable gain control or always high gain, using the I²C bus 354.

CMOS Twisted Pair Lines

In embodiments of the invention, the transmission lines that connect one or more of the circuit elements in the tuner 306 are twisted pair lines that are implemented on the CMOS substrate. For example, in the LO generation circuit 308, the differential lines 313a and 313b can be CMOS twisted pair lines. Furthermore, the CMOS twisted pair lines can be used in other parts of the tuner 306.

FIGS. 23 and 24 further illustrate CMOS twisted pair lines 2300. FIG. 23 illustrates a top view of the twisted pair 2300, which includes a transmission line 2302 and a transmission line 2304 that cross each other at junctions 2306 and 2308. FIG. 24 illustrates an isometric view of the twisted pair 2300. As shown in FIG. 24, the transmission line 2302 includes a first metal 2404 and a second metal 2402. The first metal 2404 is deposited on the CMOS substrate, and the second metal 2402 is deposited on top of the first metal 2404 to form the transmission line 2302. Likewise, the second transmission line 2304 includes a first metal 2408 and a second metal 2406. The first metal 2408 is deposited on the CMOS substrate, and the second metal 2406 is deposited on top of the first metal 2408 to form the transmission line 2304. At the junction 2306, the second metal 2402 of the transmission line 2302 crosses over the first metal 2408 of the transmission line 2304. Likewise, at the second junction 2308, the second metal 2406 of the transmission line 2304 crosses over the first metal 2404 of the transmission line 2302.

In embodiments, each section of twisted pair lines has 2 twists, which equalizes the R and C on each line. For example, in FIG. 23, the two twists are the crossover at the junctions.

In embodiments, vias (e.g. solid vias) can be added from the first metal layer to the second metal layer to lower the resistance.

The twisted pair lines 2300 improve the differential nature of the differential transmission lines when compared to conventional transmission lines. More specifically, the characteristic impedance is more carefully controlled, and impedance-perturbing effects of any nearby metal patterns are reduced. Furthermore, the fields decrease more rapidly with distance away from the twisted pair.

Furthermore, the twisted pair provides self-shielding in conjunction with differential inputs and outputs by common mode rejection. Coupling is reduced from nearby lines that run along side for distances greater than the twisted length. Furthermore, the current path twists in both the horizontal and vertical dimensions. Furthermore, the shielding effect for differential mode is comparable to actual metal shielding.

The twisted pair shown in FIGS. 23 and 24 can be implemented in CMOS. The symmetrical structure allows for easy layout as a mosaic. Two separate twisted pairs can be stacked vertically in standard 5 metal processes. Staggered twists or different twist pitch keeps lines isolated. Metal is used to its maximum effect. In other words, all of the cross section is used to pass signal current with low resistance.

Furthermore, the CMOS twisted pair reduces or eliminates the need for shielding metal on the sides or bottom of the circuit. These shields add unwanted capacitance and lowers the characteristic impedance of the substrate.

Conclusion

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A local oscillator generation circuit, comprising:
a plurality of voltage controlled oscillators configured to generate a plurality of differential local oscillator (LO) signals that each cover a different frequency range;
a plurality of amplifiers coupled to respective outputs of said VCOs, wherein a VCO is selected by enabling one or more of said amplifiers that correspond to said selected VCO to provide an output LO signal, and disabling more one or more amplifiers that do not correspond to said selected VCO;
a LO correction circuit that is configured to adjust an amplitude level of said output LO signal based on a control signal, said control signal based on measuring said amplitude level of said output LO signal.

2. The local oscillator generation circuit of claim 1, wherein said means for generating further comprises a plurality of polyphase circuits that correspond to said plurality of local oscillator signals, each polyphase circuit configured to generate said output LO signal with in phase (I) and quadrature (Q) components.

3. The local oscillator generation circuit of claim 1, wherein said LO correction circuit comprises:
a variable amplifier that variably amplifies said output LO signal according to said control signal; and
a level detect circuit, connected to the output of said variable amplifier, that generates said control signal based on an output level of said variable amplifier.

4. The local oscillator generation circuit of claim 3, wherein said variable amplifier includes a field effect transistor (FET) configured so that said control signal controls a current of said FET, and thereby a gain of said variable amplifier.

5. The local oscillator generation circuit of claim 1, further comprising a feedback loop coupled across said plurality of VCOs.

6. The local oscillator generation circuit of claim 5, wherein said feedback loop compares a feedback signal with a reference signal.

7. The local oscillator generation circuit of claim 6, wherein said feedback loop includes a frequency divider that provides the feedback signal based on said output LO signal.

8. The local oscillator generation circuit of claim 6, wherein said feedback loop further includes a phase detector that compares said feedback signal with said reference signal.

9. The local oscillator generation circuit of claim 8, wherein said feedback loop further includes a charge pump driven by an output of said phase detector.

10. The local oscillator generation circuit of claim 9, wherein said feedback loop further includes a loop filter coupled to an output of said charge pump, and wherein an output of said loop filter tunes a frequency of said selected VCO.

11. A local oscillator generation circuit, comprising:
   means for generating a plurality of local oscillator (LO) signals that each cover a different frequency range;
   means for selecting an output LO signal from said plurality of differential LO signals; and
   a LO correction circuit that is configured to adjust an amplitude level of said output LO signal based on a control signal, said control signal based on measuring said amplitude level of said output LO signal, said LO correction circuit including,
      a variable amplifier that variably amplifies said output LO signal according to said control signal; and
      a level detect circuit, connected to the output of said variable amplifier, that generates said control signal based on an output level of said variable amplifier.

12. A local oscillator generation circuit, comprising:
   a plurality of voltage controlled oscillators configured to generate a plurality of differential local oscillator (LO) signals that each cover a different frequency range;
   a plurality of amplifiers coupled to respective outputs of said VCOs, wherein a VCO is selected by enabling one or more of said amplifiers that correspond to said selected VCO to provide an output LO signal; and
   a LO correction circuit that is configured to adjust an amplitude level of said output LO signal based on a control signal, said control signal based on measuring said amplitude level of said output LO signal; said LO correction circuit including,
      a variable amplifier that variably amplifies said output LO signal according to said control signal; and
      a level detect circuit, connected to the output of said variable amplifier, that generates said control signal based on an output level of said variable amplifier.

* * * * *

UNITED STATES PATENT AND TRADEMARK OFFICE
CERTIFICATE OF CORRECTION

| | |
|---|---|
| PATENT NO. | : 7,734,272 B2 |
| APPLICATION NO. | : 11/976181 |
| DATED | : June 8, 2010 |
| INVENTOR(S) | : Alexandre Kral |

It is certified that error appears in the above-identified patent and that said Letters Patent is hereby corrected as shown below:

Column 11

Line 2, please replace "62+" with --622+--.

Column 24

Line 35, please replace "selected VCO;" with --selected VCO; and--.

Signed and Sealed this

Seventh Day of September, 2010

David J. Kappos
*Director of the United States Patent and Trademark Office*